(12) United States Patent
Xie et al.

(10) Patent No.: US 10,714,591 B2
(45) Date of Patent: Jul. 14, 2020

(54) GATE STRUCTURE FOR A TRANSISTOR DEVICE WITH A NOVEL PILLAR STRUCTURE POSITIONED THEREABOVE

(71) Applicant: GLOBALFOUNDRIES Inc., Grand Cayman (KY)

(72) Inventors: Ruilong Xie, Niskayuna, NY (US); Youngtag Woo, San Ramon, CA (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/777,243

(22) Filed: Jan. 30, 2020

(65) Prior Publication Data

US 2020/0176587 A1    Jun. 4, 2020

Related U.S. Application Data

(63) Continuation of application No. 16/156,325, filed on Oct. 10, 2018.

(51) Int. Cl.
  *H01L 21/02*  (2006.01)
  *H01L 29/66*  (2006.01)
  (Continued)

(52) U.S. Cl.
  CPC .. *H01L 29/66545* (2013.01); *H01L 21/28079* (2013.01); *H01L 21/28088* (2013.01); *H01L 21/28194* (2013.01); *H01L 21/31144* (2013.01); *H01L 21/823431* (2013.01); *H01L 21/823437* (2013.01); *H01L 29/4958* (2013.01); *H01L 29/4966* (2013.01); *H01L 29/517* (2013.01); *H01L 29/6656* (2013.01); H01L 21/0273 (2013.01); H01L 21/02181 (2013.01); H01L 21/02271 (2013.01); H01L 21/31053 (2013.01); H01L 21/32139 (2013.01)

(58) Field of Classification Search
  CPC ....... H01L 21/823431; H01L 29/66545; H01L 29/66795; H01L 27/0886; H01L 21/823821
  See application file for complete search history.

(56) References Cited

U.S. PATENT DOCUMENTS

| 5,648,283 A | 7/1997 | Tsang et al. |
| 9,812,365 B1 * | 11/2017 | Zhang ............... H01L 29/66545 |

(Continued)

*Primary Examiner* — Jaehwan Oh
(74) *Attorney, Agent, or Firm* — Amerson Law Firm, PLLC

(57) ABSTRACT

One illustrative transistor device disclosed herein includes a final gate structure that includes a gate insulation layer comprising a high-k material and a conductive gate, wherein the gate structure has an axial length in a direction that corresponds to a gate width direction of the transistor device. The device also includes a sidewall spacer contacting opposing lateral sidewalls of the final gate structure and a pillar structure (comprised of a pillar material) positioned above at least a portion of the final gate structure, wherein, when the pillar structure is viewed in a cross-section taken through the pillar structure in a direction that corresponds to the gate width direction of the transistor device, the pillar structure comprises an outer perimeter and wherein a layer of the high-k material is positioned around the entire outer perimeter of the pillar material.

16 Claims, 28 Drawing Sheets

(51) Int. Cl.
*H01L 21/28* (2006.01)
*H01L 29/49* (2006.01)
*H01L 29/51* (2006.01)
*H01L 21/8234* (2006.01)
*H01L 21/311* (2006.01)
H01L 21/3105 (2006.01)
H01L 21/3213 (2006.01)
H01L 21/027 (2006.01)

(56) References Cited

U.S. PATENT DOCUMENTS

| | | | |
|---|---|---|---|
| 9,842,778 B2* | 12/2017 | You | H01L 21/823821 |
| 10,366,930 B1* | 7/2019 | Xie | H01L 27/0886 |
| 2015/0236106 A1 | 8/2015 | Zaleski et al. | |

* cited by examiner

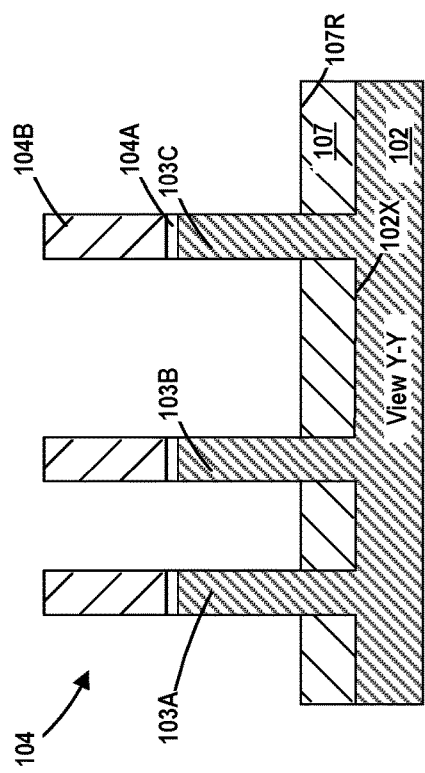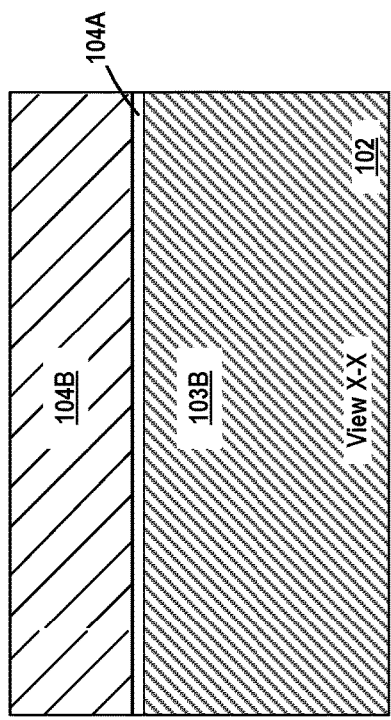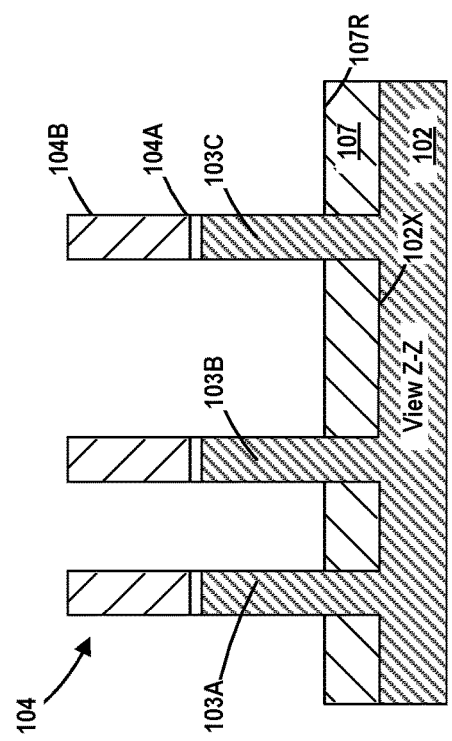

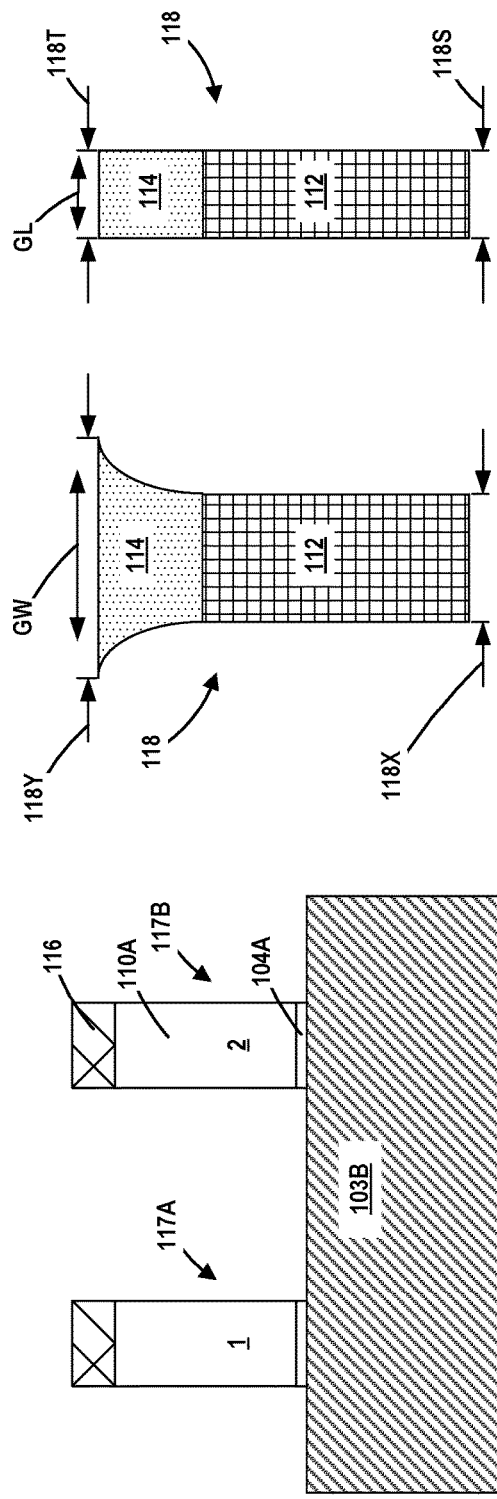
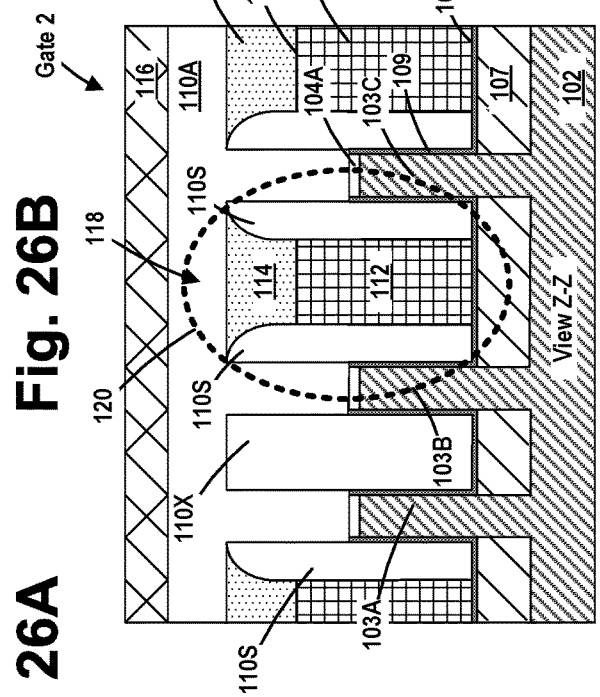
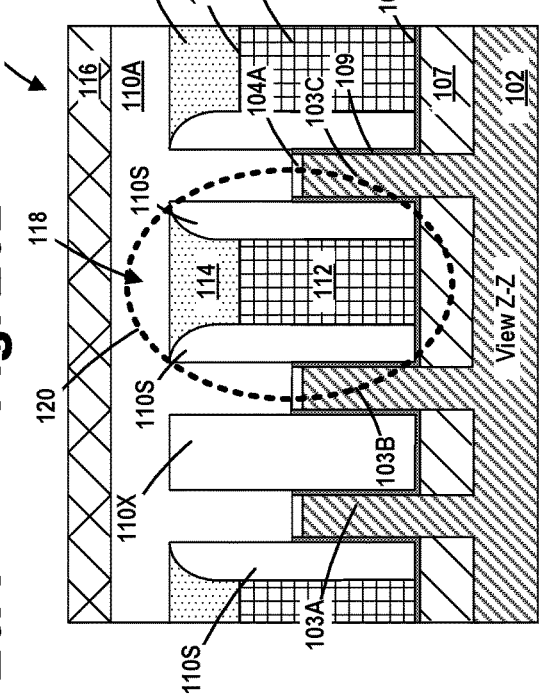
Fig. 23
Fig. 24
Fig. 25
Fig. 26A
Fig. 26B

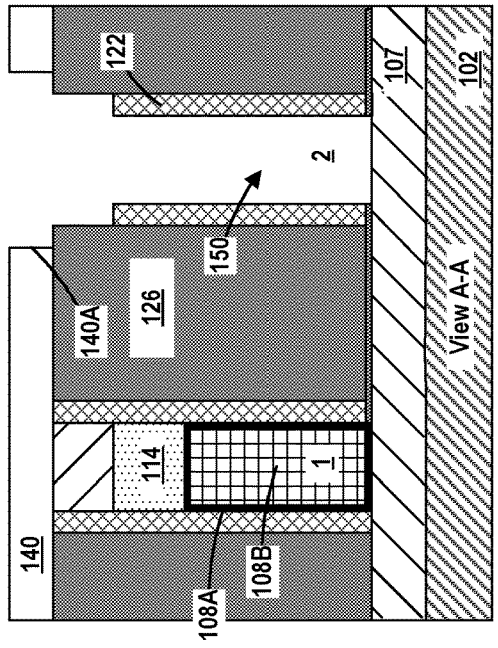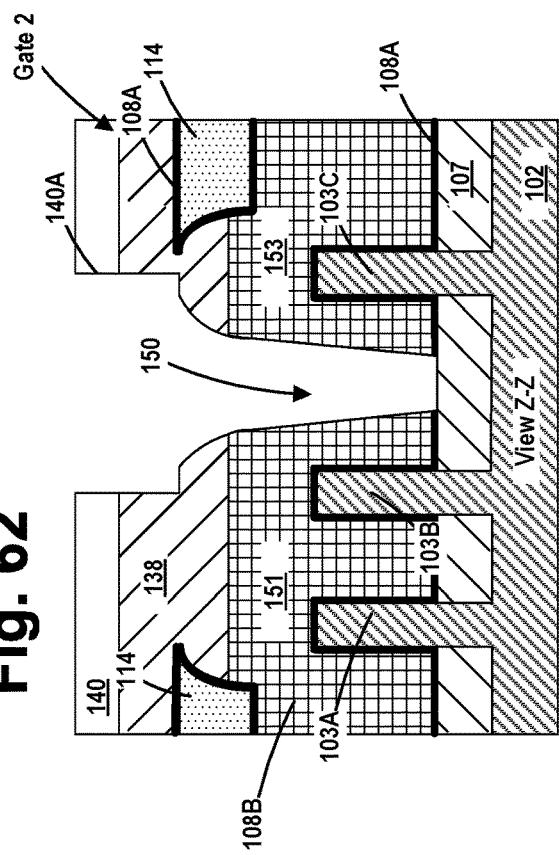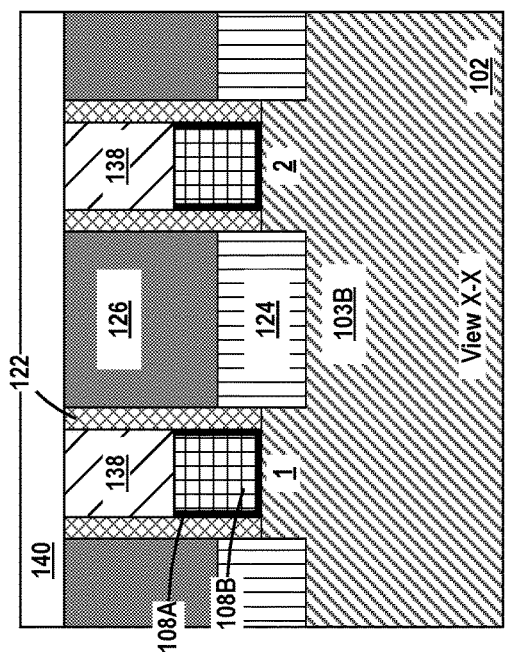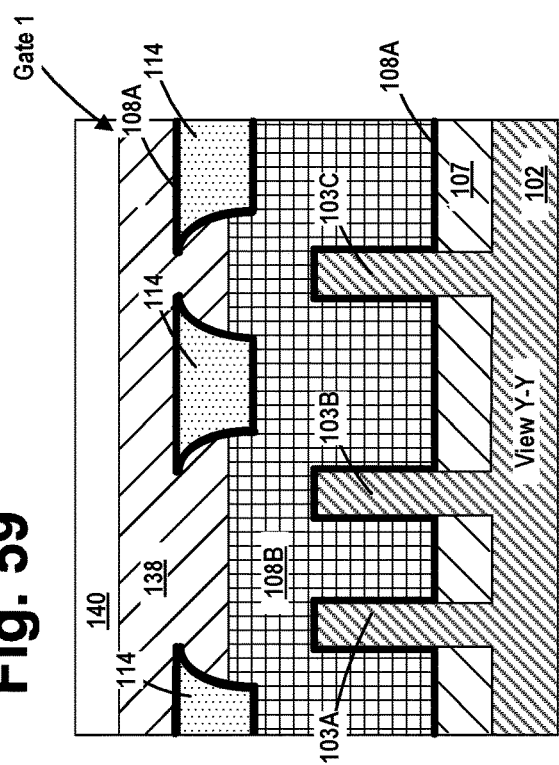

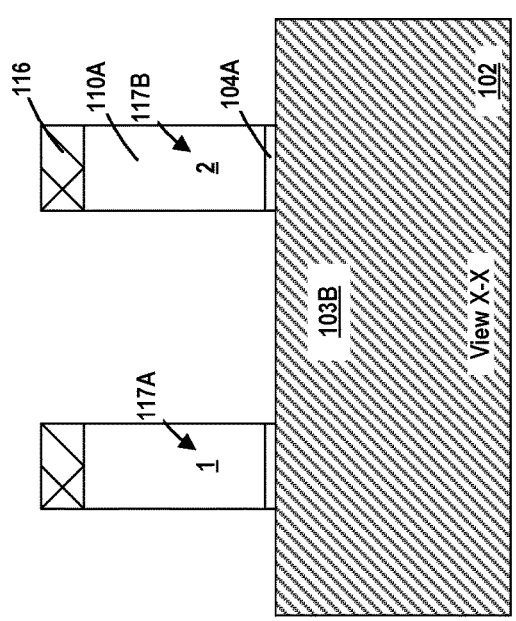
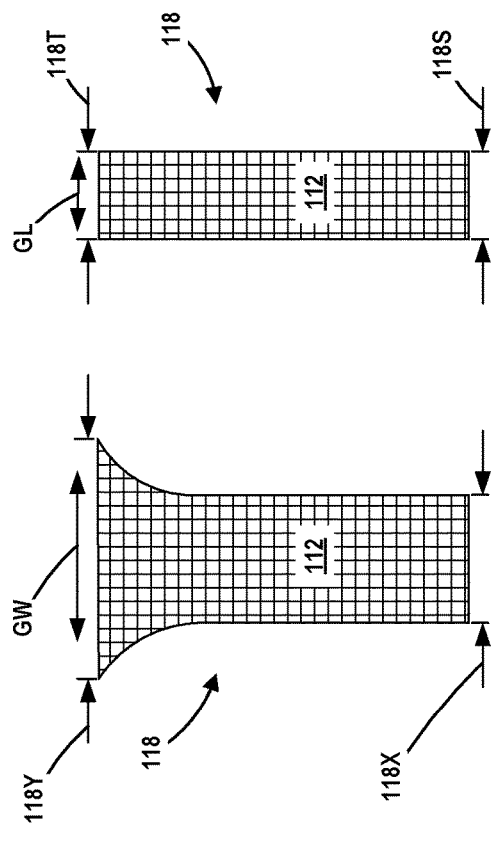
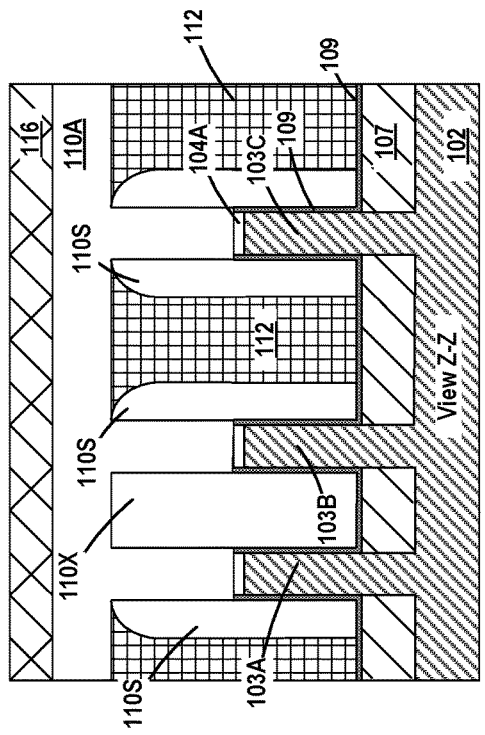
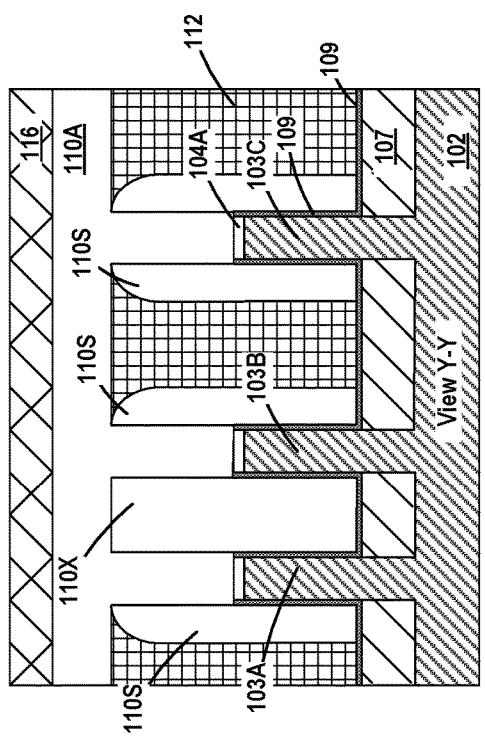

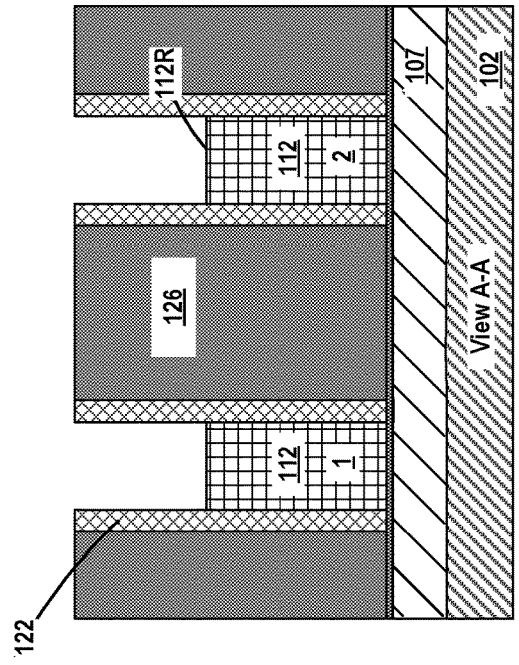
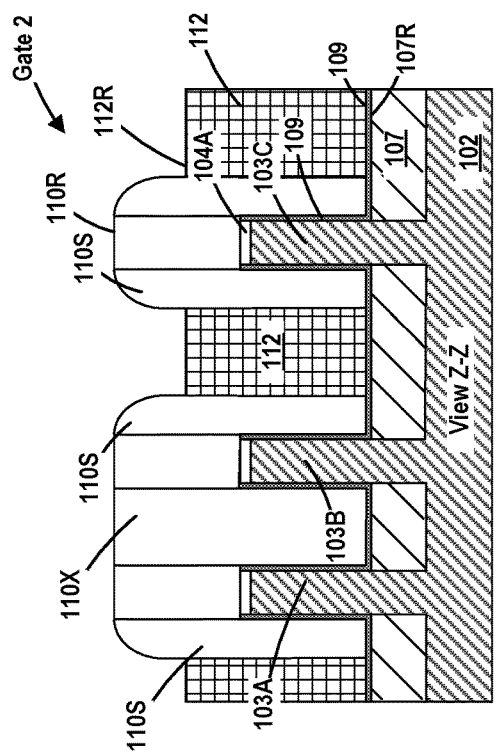
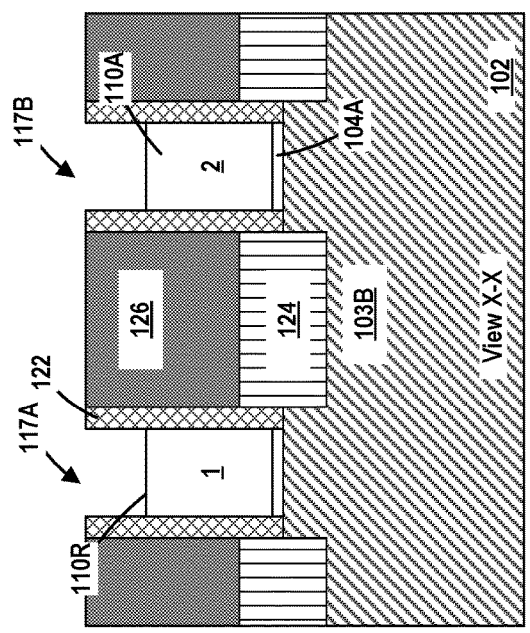
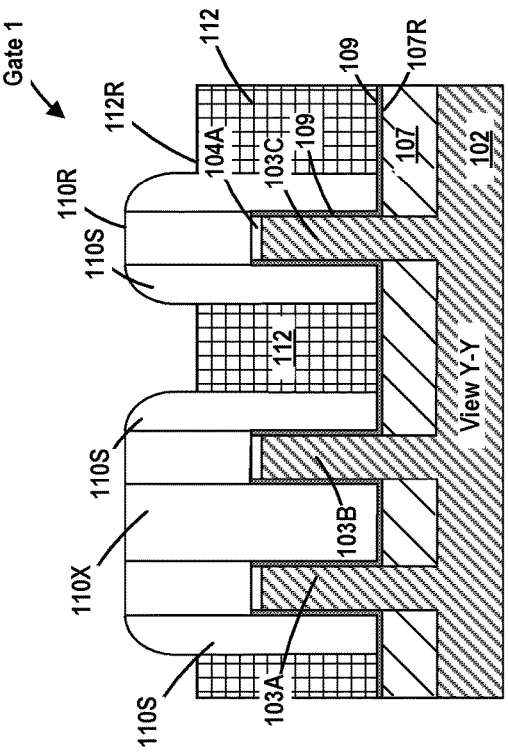
Fig. 87
Fig. 88
Fig. 89
Fig. 90

GATE STRUCTURE FOR A TRANSISTOR DEVICE WITH A NOVEL PILLAR STRUCTURE POSITIONED THEREABOVE

BACKGROUND

1. Field of the Disclosure

The present disclosure generally relates to the fabrication of integrated circuits, and, more particularly, to various embodiments of a novel gate structure for a transistor with a novel pillar structure positioned there above.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc.

In advanced integrated circuit (IC) products, the gate structures for the transistor devices are typically manufactured using well-known replacement gate (or "gate-last") manufacturing techniques. In general, the replacement gate manufacturing technique involves the formation of a sacrificial (or "dummy") gate structure comprised of a sacrificial gate insulation layer (e.g., silicon dioxide) and a layer of a sacrificial gate electrode material (e.g., polysilicon or amorphous silicon). The sacrificial gate structures are initially formed as continuous line-type structures that extend across the entire substrate, including across both active regions and isolation regions located between active regions.

The long continuous line-type sacrificial gate structures are formed by depositing the materials for the sacrificial gate structures across the entire substrate, forming a patterned gate etch mask above the deposited sacrificial gate materials and performing one or more etching processes through the patterned gate etch mask to remove the exposed portions of the sacrificial gate materials. At that point, a spacer structure will be formed adjacent the long continuous line-type sacrificial gate structures. Various process operations are performed with the sacrificial gate structure in position, e.g., source/drain implantation processes, the formation of epi semiconductor material in the source/drain regions of the transistor devices, etc.

At some point after other processing has occurred, e.g., after formation of epi material in the source/drain regions of the devices, a patterned etch mask—a "gate-cut" mask—is formed above the product. The gate cut mask includes openings at locations where it is desired to remove or "cut" portions of the long continuous line-type sacrificial gate structures so as to form or define individual portions or segments of the original long continuous line-type sacrificial gate structures. One or more etching processes are performed to remove exposed portions of the gate cap and the sacrificial gate structure and thereby form a gate cut opening between the now-separate individual portions or segments of the original long continuous line-type sacrificial gate structures. An insulating material will be formed in the gate cut opening. Eventually, these individual portions or segments of the original long continuous line-type sacrificial gate structures will be removed and replaced with final replacement gate structures.

As device dimensions continue to decrease and as packing densities of transistor devices on a substrate continue to increase, various problems have arisen as it relates to performing the gate-cut process operation involved when using traditional replacement gate manufacturing techniques. For example, as device scaling continues, the critical dimension (CD) of the gate cut opening (in the gate width direction of the transistors) continues to shrink. Additionally, due to the closer spacing between adjacent transistor devices, it is very important that the gate cut opening be located as precisely as possible in the exact middle of the space between adjacent transistor devices. Any offset in the placement of the gate cut opening and/or forming the gate cut opening with a larger than desired CD can be problematic as it relates to the formation of additional materials and structures on the IC product as manufacturing operations proceed. Such problems may make the formation of quality replacement gate structures more difficult and may result in decreased device performance or complete device failure.

The present disclosure is directed to various methods of cutting gate structures in a self-aligned manner and to various embodiments of a multilayer gate-cut pillar structure and integrated circuit products that incorporate such structures as well as various embodiments of a novel gate structure for a transistor with a novel pillar structure positioned there above that may solve or at least reduce one or more of the problems described above.

SUMMARY

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various embodiments of a novel gate structure for a transistor with a novel pillar structure positioned there above. One illustrative transistor device disclosed herein includes a final gate structure that includes a gate insulation layer comprising a high-k material and a conductive gate, wherein the gate structure has an axial length in a direction that corresponds to a gate width direction of the transistor device. The device also includes a sidewall spacer contacting opposing lateral sidewalls of the final gate structure and a pillar structure (comprised of a pillar material) positioned above at least a portion of the final gate structure, wherein, when the pillar structure is viewed in a cross-section taken through the pillar structure in a direction that corresponds to the gate width direction of the transistor device, the pillar structure comprises an outer perimeter and wherein a layer of the high-k material is positioned around the entire outer perimeter of the pillar material.

BRIEF DESCRIPTION OF THE DRAWINGS

The disclosure may be understood by reference to the following description taken in conjunction with the accompanying drawings, in which like reference numerals identify like elements, and in which:

FIGS. 67-98 depict yet another illustrative method of cutting gate structures in a self-aligned manner, various embodiments of a multilayer gate-cut pillar structure and various novel integrated circuit (IC) product structures.

Figure 1:
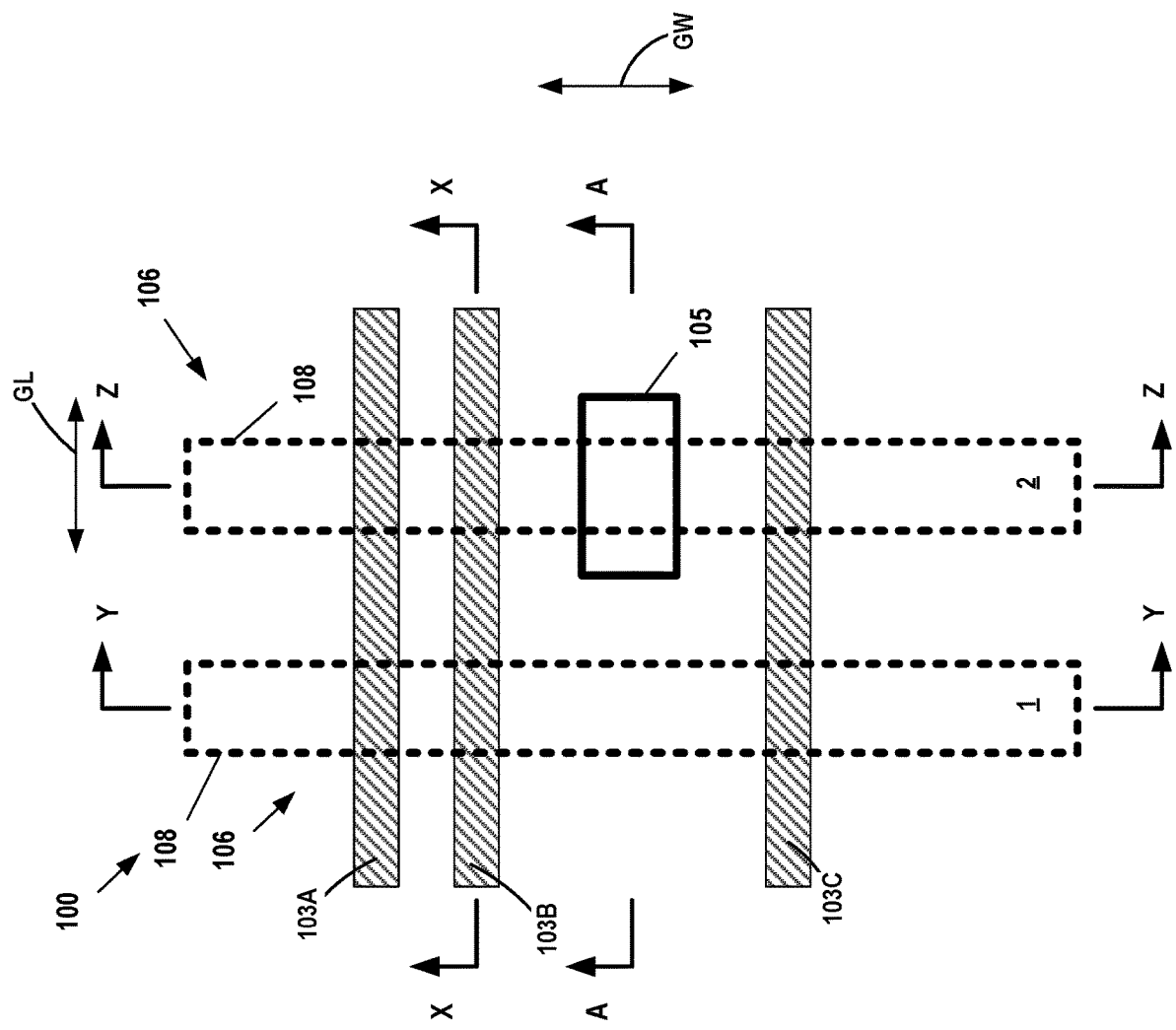
FIGS. 1-66 depict one illustrative method of cutting gate structures in a self-aligned manner, various embodiments of a multilayer gate-cut pillar structure and various novel integrated circuit (IC) product structures.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of cutting gate structures in a self-aligned manner and to various embodiments of a multilayer gate-cut pillar structure and integrated circuit products that incorporate such structures. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, etc. In the illustrative examples depicted herein, the transistor devices will be FinFET devices. Thus, the presently claimed inventions should not be considered to be limited to any particular form of transistors. Of course, the claimed inventions should not be considered to be limited to the illustrative examples depicted and described herein. With reference to the attached figures, various illustrative embodiments of the methods and devices disclosed herein will now be described in more detail. The various layers of material described below may be formed by performing any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 98:
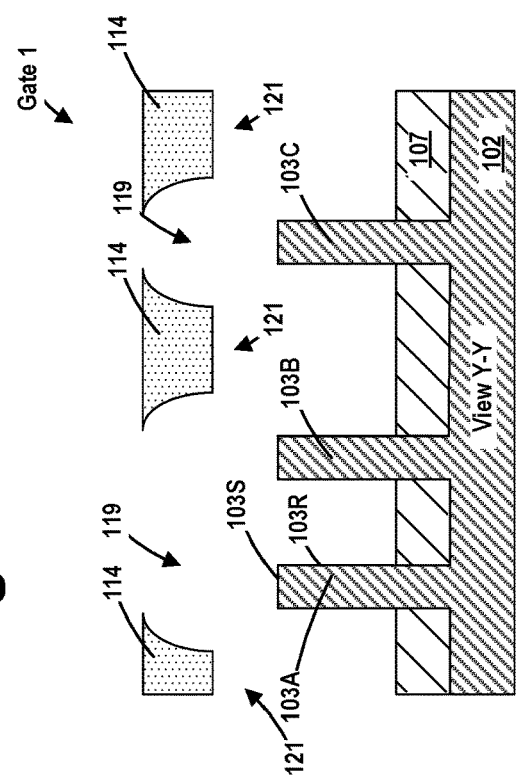

FIGS. 1-98 depict various illustrative methods of cutting gate structures in a self-aligned manner, various embodiments of a multilayer gate-cut pillar structure and various novel integrated circuit (IC) product 100 structures including various embodiments of a novel gate structure for a transistor with a novel pillar structure positioned there above. FIG. 1 is a simplistic plan view of one illustrative embodiment of an IC product 100 that may be formed using the methods described herein. FIG. 1 depicts a plurality of fins 103A-C (collectively referenced using the numeral 103) as well as a plurality a plurality of gates 106 (numbered 1-2 for ease of reference) that will eventually be formed on the IC product for various transistor devices. Each of the gates 106 comprise a final gate structure 108 (depicted in dashed lines). Various cross-sectional views of the product 100 (views "A-A", "X-X", "Y-Y and "Z-Z") depicted in the attached drawings are taken where indicated in FIG. 1. The cross-sectional views Y-Y and Z-Z are through the axial length of the gates 106 in the gate width (GW) direction of the transistor devices. The cross-sectional views A-A and X-X are taken in the gate length (GL—current transport) direction of the transistor devices. The view X-X is a cross-sectional view taken through the long axis of the fin 103B. Additionally, the area 105 in FIG. 1 depicts the location at which a portion of the axial length of the final gate structure 108 of gate 2 will be cut using the methods and devices disclosed herein. In the illustrative example depicted herein, the transistor devices are FinFET devices. The cross-sectional view A-A in the drawings is taken through gate number 2 in the gate length (GL) direction of the transistor devices at the location 105 where the gate structure 108 of gate 2 will be cut.

The substrate 102 (see FIG. 2) may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIGS. 2-4 depict the product 100 after several process operations were performed. More specifically, the fins 103 were formed in the substrate 102 using traditional manufacturing techniques. For example, a patterned fin-formation etch mask 104 (comprised of, for example, a layer of silicon dioxide 104A and a layer of silicon nitride 104B) was formed above the substrate 102. Thereafter, one or more etching processes, e.g., anisotropic etching processes, were performed through the patterned fin-formation etch mask 104 to form a plurality of fin-formation trenches 102X in the substrate 102 and thereby define the plurality of fins 103. The width and height of the fins 103 may vary depending upon the particular application. Additionally, the overall size, shape and configuration of the fin-formation trenches 102X and fins 103 may vary depending on the particular application. Next, a recessed layer of insulating material 107 (e.g., silicon dioxide) with a recessed upper surface 107R was formed between the fins 103 by performing traditional manufacturing techniques.

Figure 6:
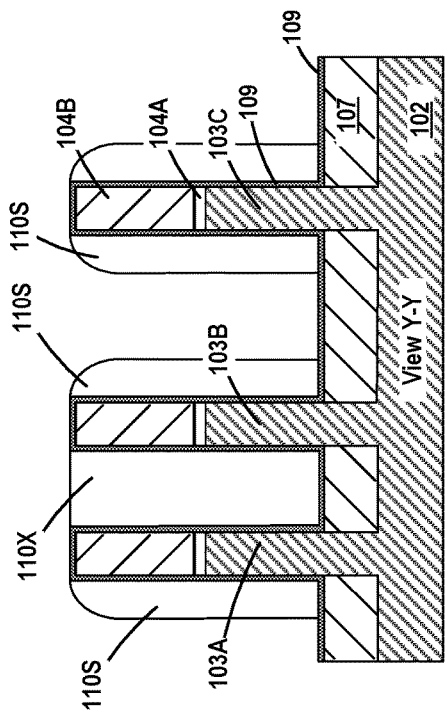
Figure 5:
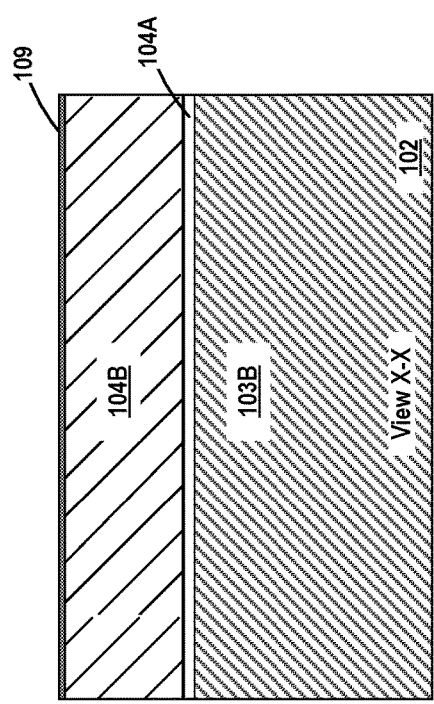
Figure 7:
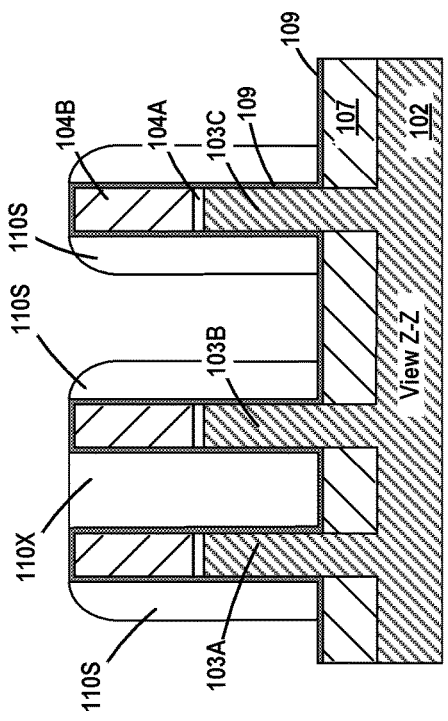

FIGS. 5-7 depict the product 100 after several process operations were performed. First, a conformal deposition process was performed to form a relatively thin layer of insulating material 109, e.g., silicon dioxide, on the product 100. Thereafter, sacrificial material 110 was blanket-deposited on the product and an anisotropic etching process was performed to form a plurality of spacers 110S. The spacers 110S extend axially along the sides of the fins 103 in the gate length direction of the devices. Note that the space between fins 103A-103B is substantially filled with a block 110X of the material 110 as the fin pitch between the fins 103A-B may effectively not allow for formation of individual sacrificial spacers 110S in the space between the fins 103A-B. The spacers 110S may be of any desired thickness (as measured at their base). The sacrificial material 110 may be any material, e.g., amorphous silicon, polysilicon, titanium oxide, etc. In one illustrative process flow disclosed herein, the final gate structures 108 may be manufactured using replacement gate manufacturing techniques. In such a situation, the material selected for the sacrificial material 110 may be the same as the material selected for the sacrificial gate structures formed in replacement gate manufacturing processes.

Figure 8:
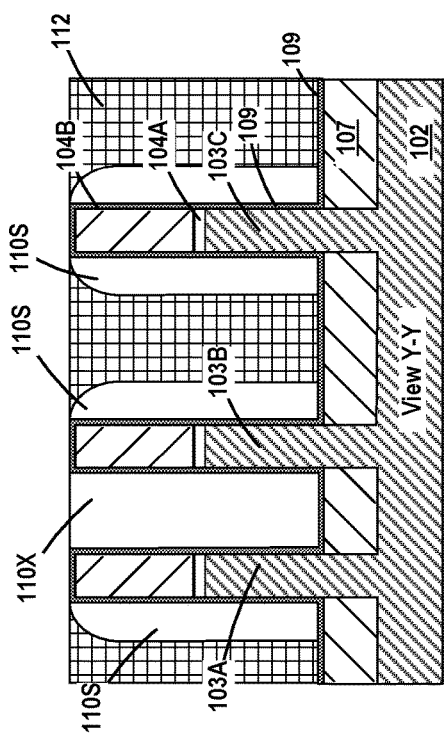
Figure 9:
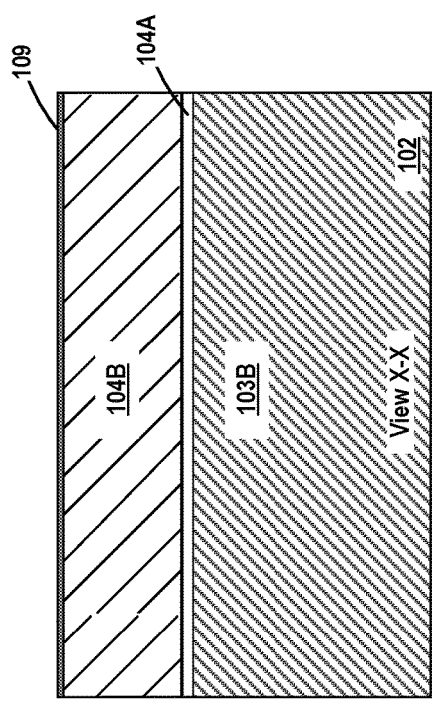
Figure 10:
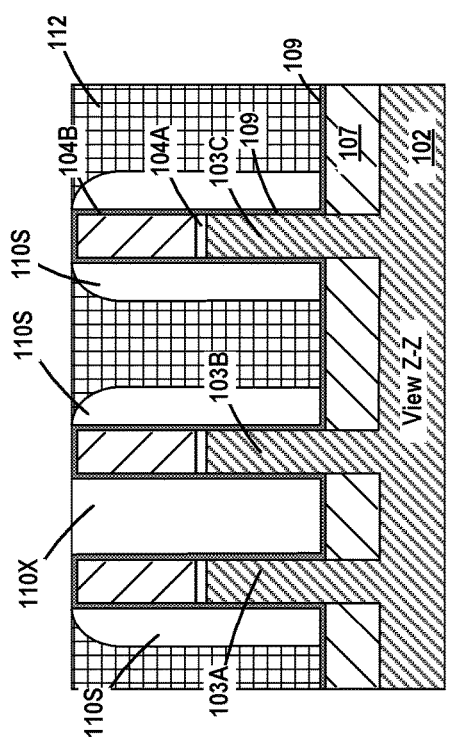

FIGS. 8-10 depict the product 100 after several process operations were performed. First, a second sacrificial material 112 was formed across the product 100 in the spaces between the sacrificial spacers 110S. Thereafter, a CMP and/or etch-back process was performed on the sacrificial material 112 such that the upper surface of the sacrificial material 112 is substantially planar with the upper surface of the insulating material 109 as well as the uppers surface of the block 110X of the sacrificial material 110. As will be described more fully below, in one illustrative process flow, the sacrificial material 112 will become a part of a novel multilayer gate-cut structure 118. The sacrificial material 112 may be comprised of any material that may be selectively etched relative to the material of the sacrificial material 110. For example, the sacrificial material 112 may be comprised of silicon-germanium, germanium, titanium oxide, etc. The sacrificial material 112 may be formed by performing a traditional CVD deposition process so as to overfill the spaces between the sacrificial spacers 110S.

Figure 12:
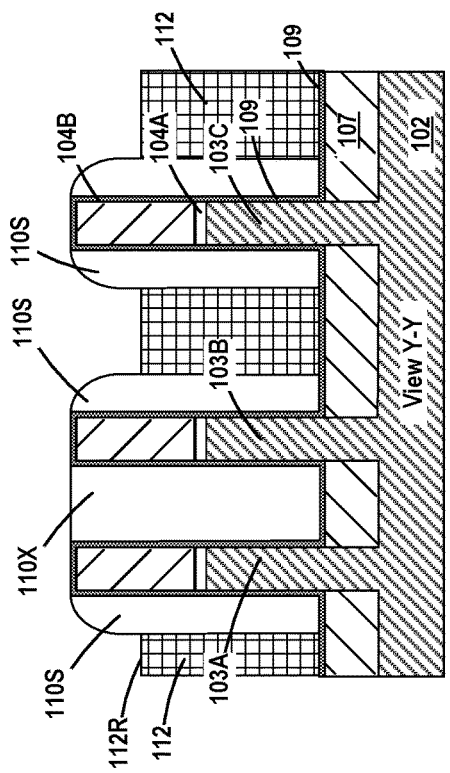
Figure 11:
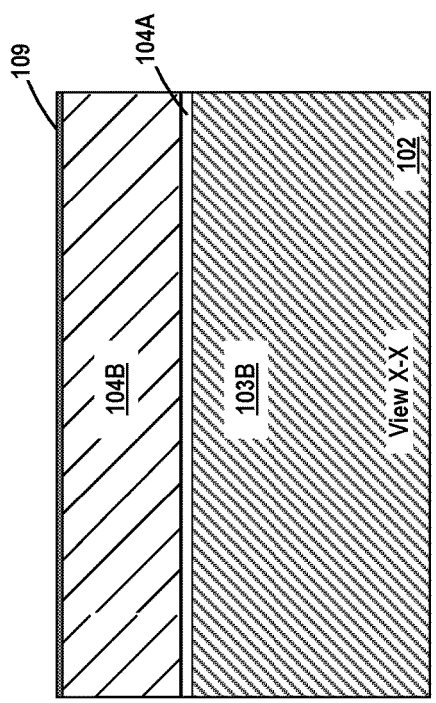
Figure 13:
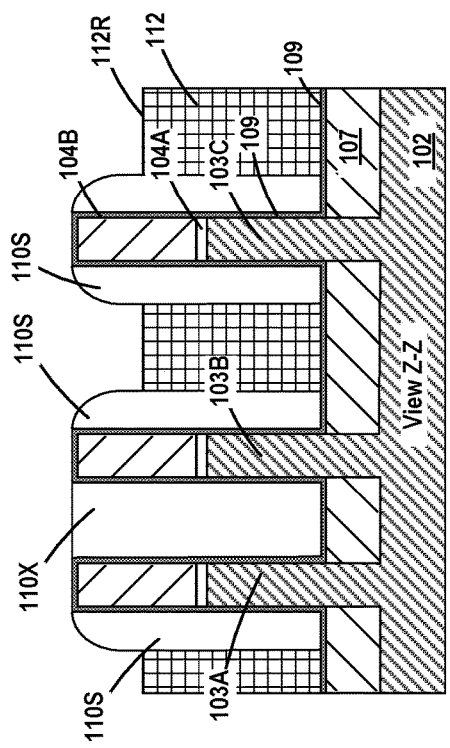

FIGS. 11-13 depict the product 100 after a recess etching process was performed on the sacrificial material 112 such that it has a recessed upper surface 112R. The amount of recessing of the sacrificial material 112 may vary depending upon the particular application. In one illustrative embodiment, based upon current-day technology, the sacrificial material 112 may be recessed about 10-30 nm.

Figure 15:
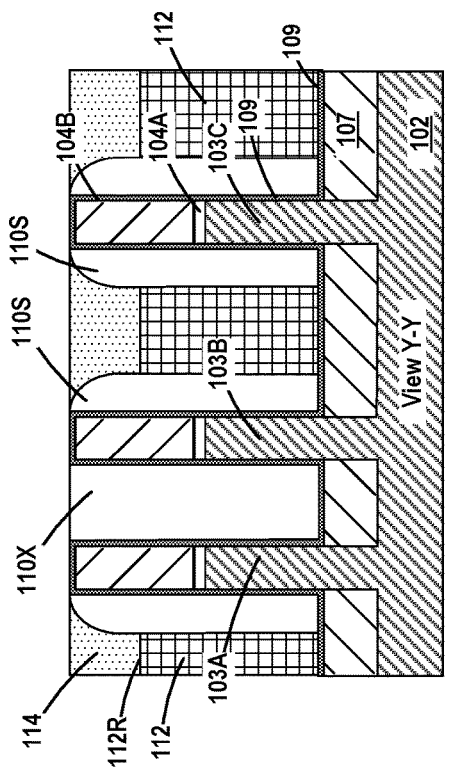
Figure 14:
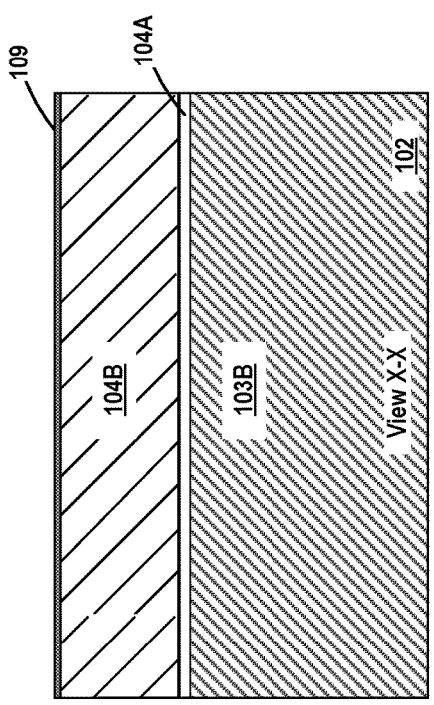
Figure 16:
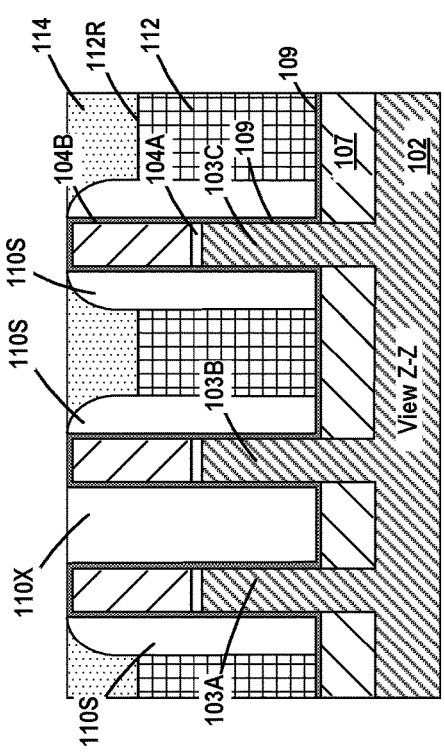

FIGS. 14-16 depict the product 100 after several process operations were performed. First, a layer of material 114 was formed across the product 100 above the recessed layer of sacrificial material 112 in the spaces between the sacrificial spacers 110S. Thereafter, a CMP and/or etch-back process was performed on the layer of material 114 such that the upper surface of the layer of material 114 is substantially planar with the upper surface of the insulating material 109 as well as the upper surface of the block 110X of the sacrificial material 110. As will be described more fully below, in one illustrative process flow, the layer of material 114 will become a part of a novel multilayer gate-cut structure 118. The layer of material 114 may be comprised of any material that may be selectively etched relative to the material of the sacrificial material 110 and the layer of sacrificial material layer 112. For example, the layer of material 114 may be comprised of silicon-carbon, SiOC, etc. The layer of material 114 may be formed by performing a traditional CVD deposition process so as to overfill the spaces between the sacrificial spacers 110S above the recessed layer of sacrificial material 112.

Figure 18:
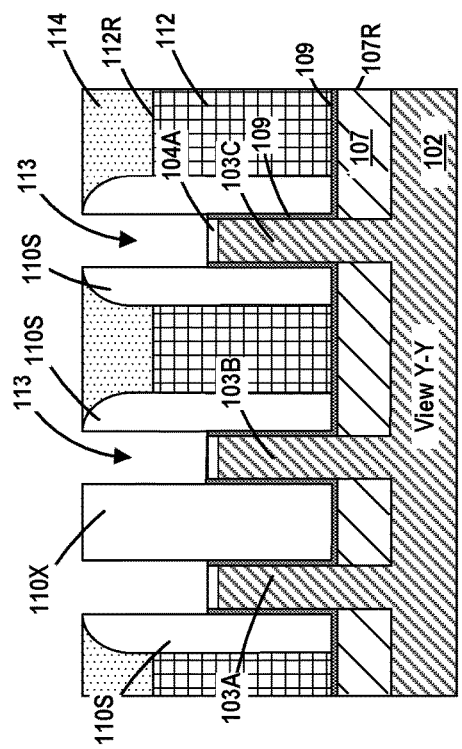
Figure 17:
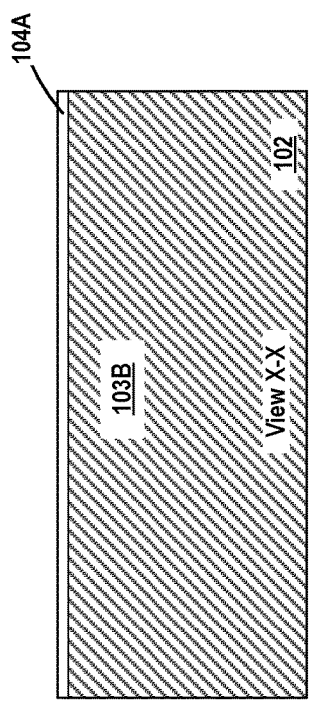
Figure 19:
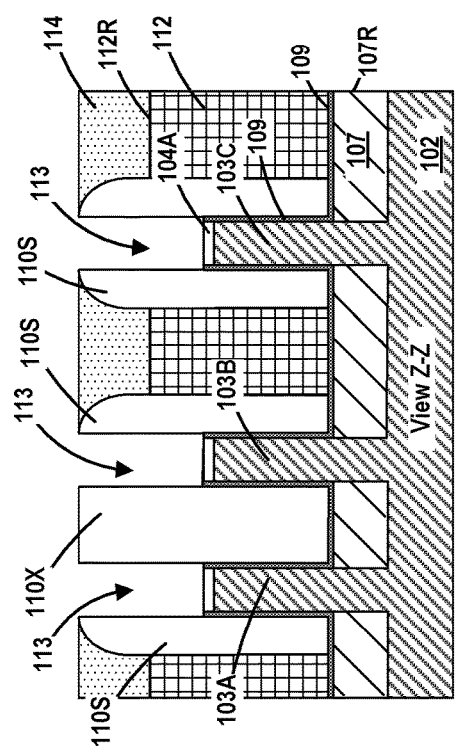

FIGS. 17-19 depict the product 100 after several process operations were performed. First, one or more etching process were performed to remove the exposed portions of the layer of insulating material 109 so as to expose the portion 104B of the patterned etch mask 104. Thereafter, the portions 104B of the patterned etch mask 104 was removed. As part of these process operations, portions of the layer of insulating material 109 positioned above the portion 104A of the patterned etch mask 104 may also be removed selectively relative to surrounding materials. If desired, a brief etching process may be performed to insure that the desired portions of the layer of insulating material 109 are removed. At the conclusion of these process operations, the layer 104A of the patterned etch mask 104 may still cover the upper surface of the fins 103. These process operations result in the formation of recesses or cavities 113 above the fins 103.

Figure 22:
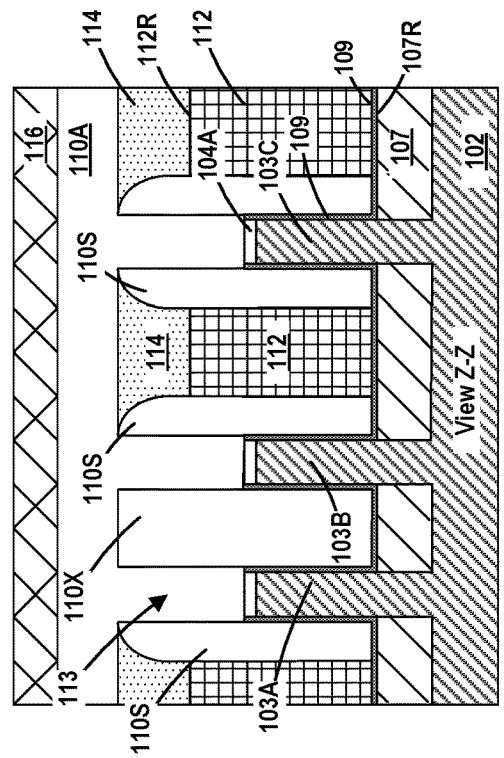
Figure 20:
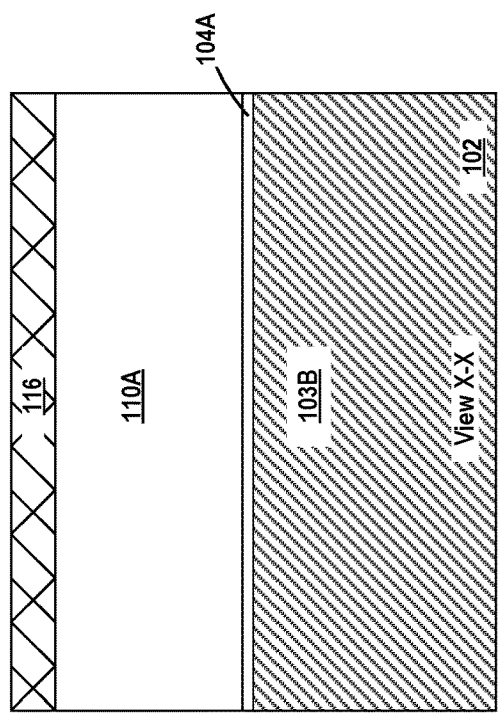
Figure 21:
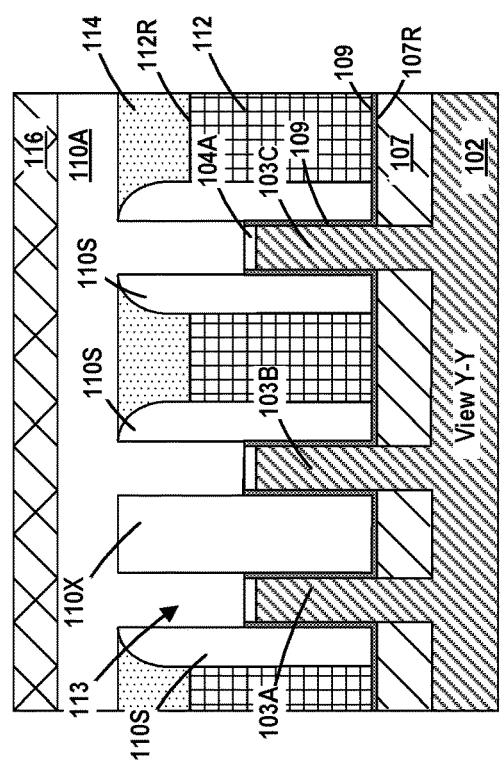
Figure 27:
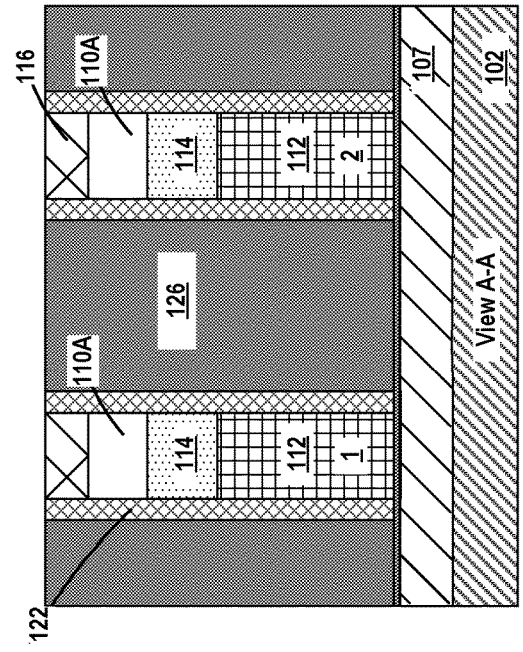
Figure 29:
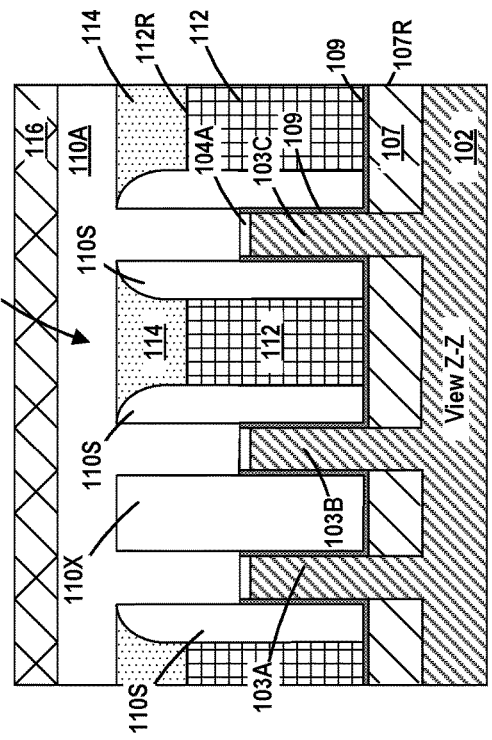
Figure 30:
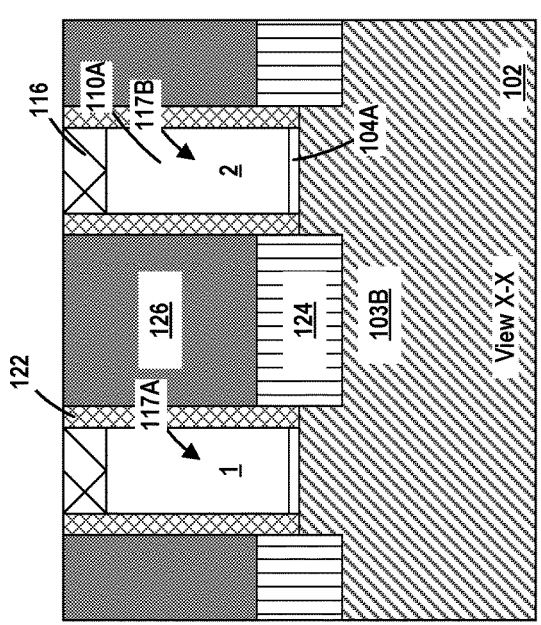
Figure 28:
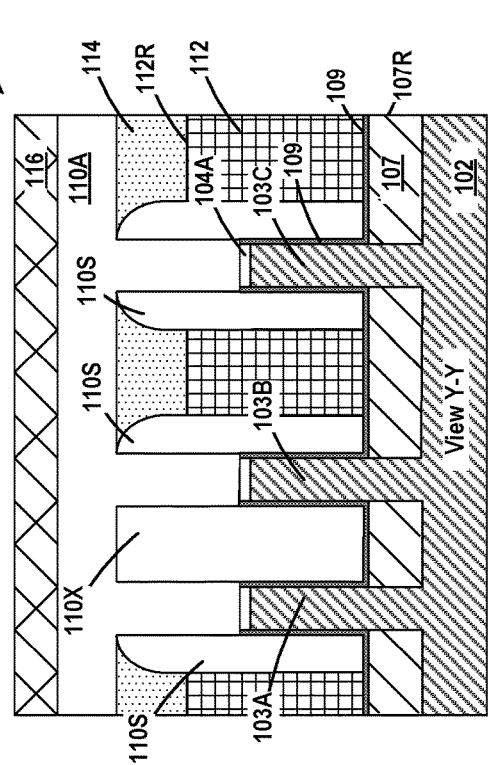
Figure 31:
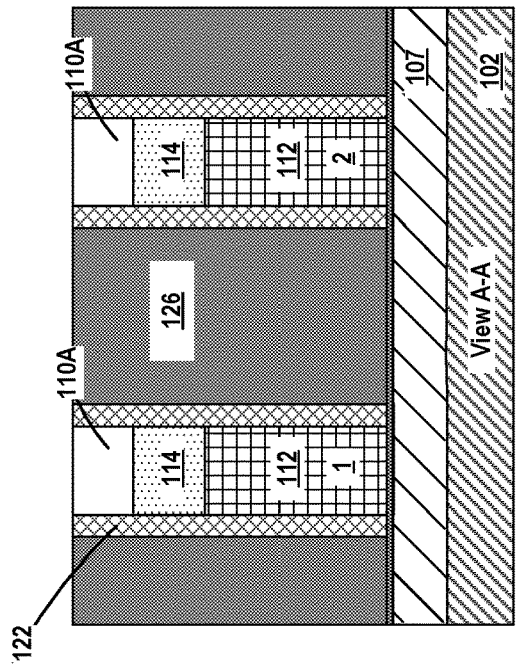
Figure 34:
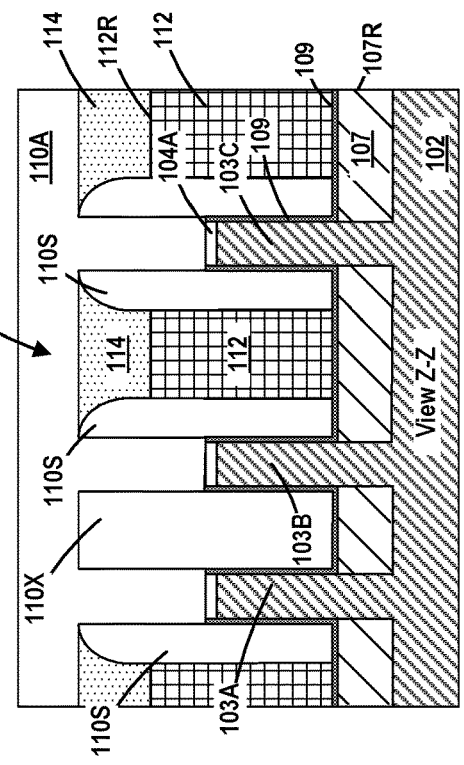
Figure 32:
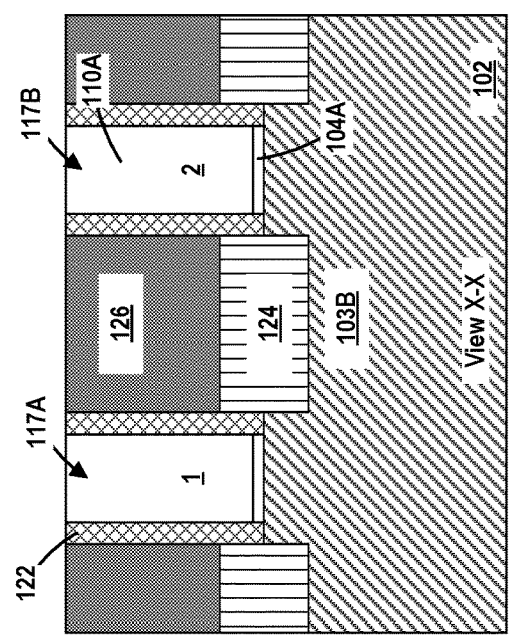
Figure 33:
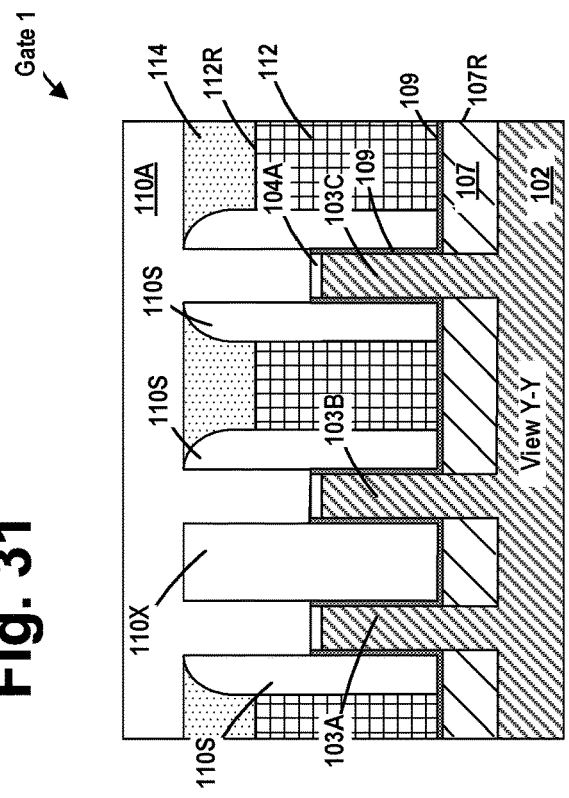
Figure 38:
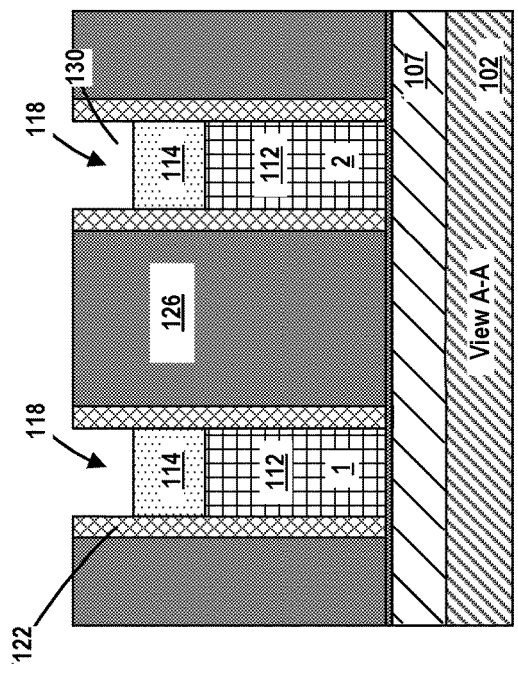
Figure 37:
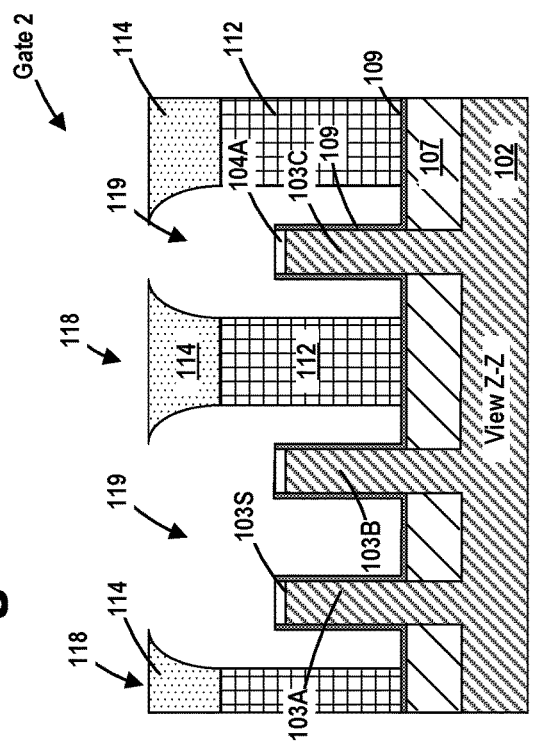
Figure 35:
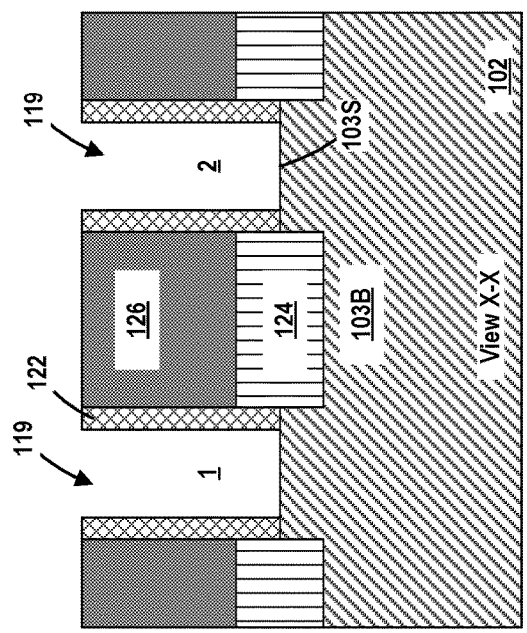
Figure 36:
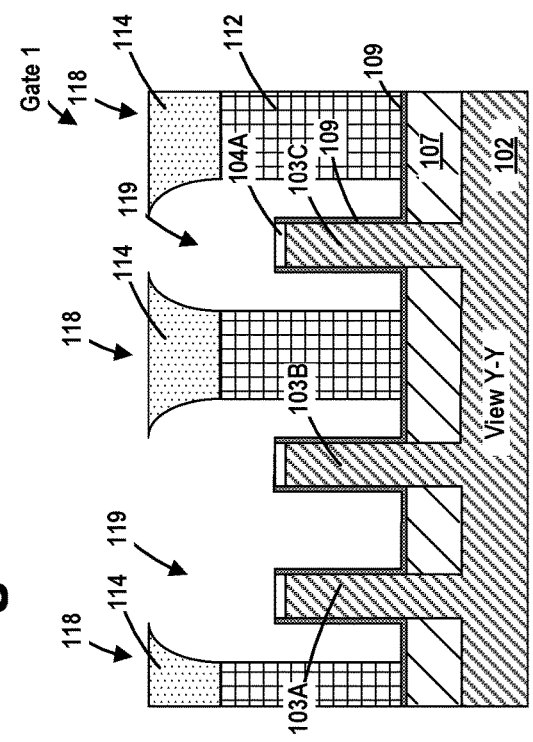
Figure 39:
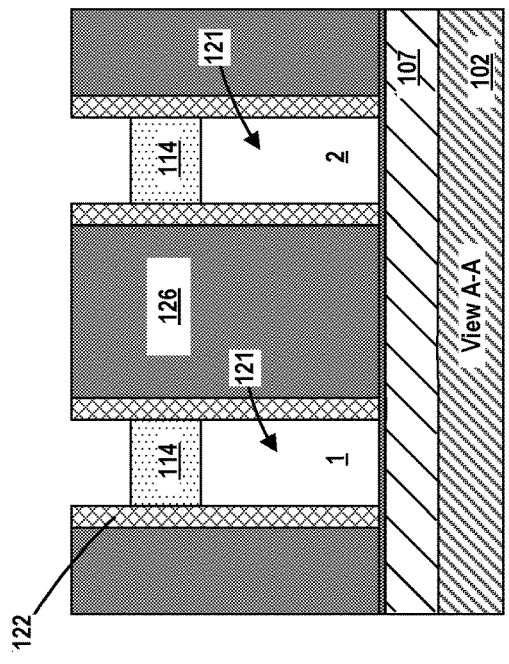
Figure 42:
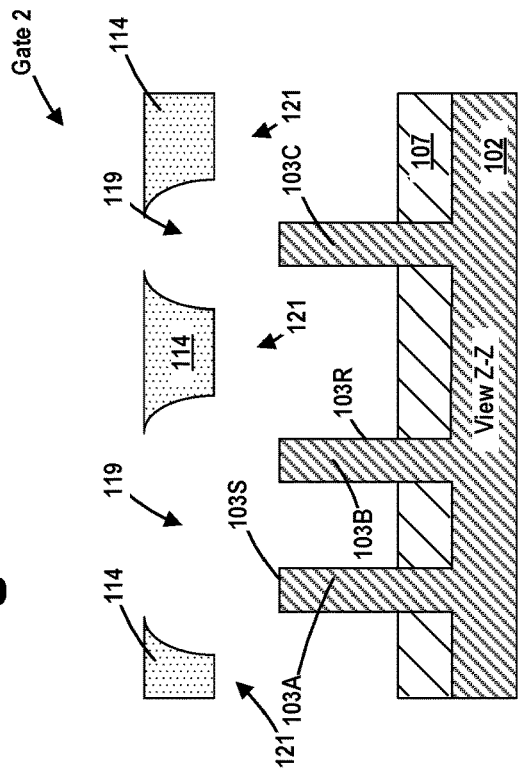
Figure 40:
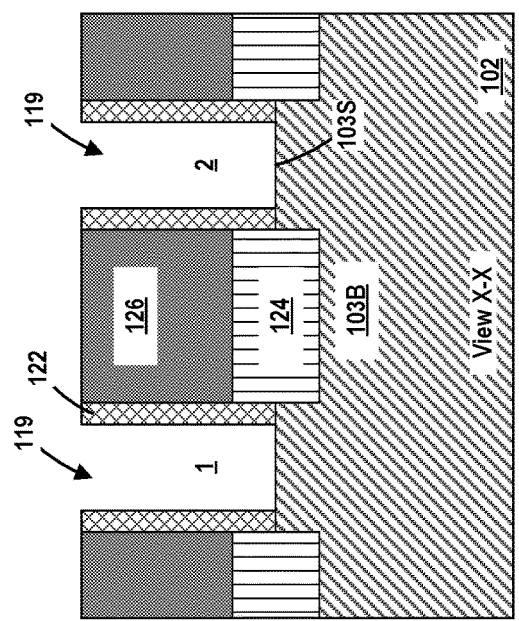
Figure 41:
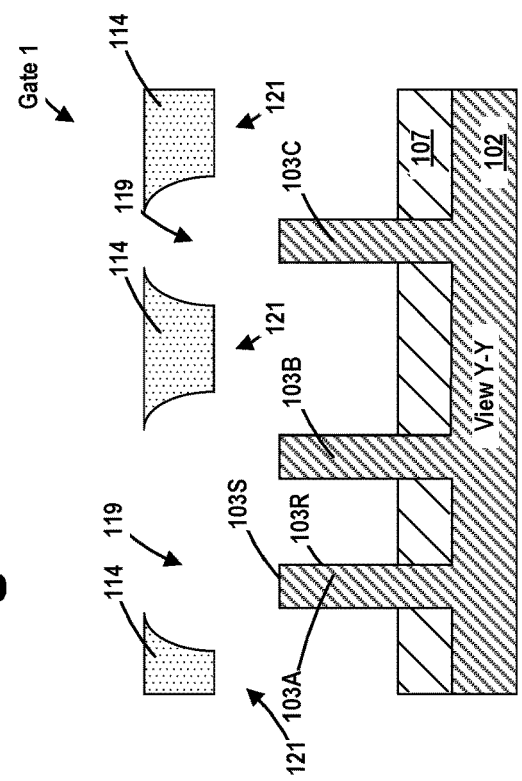
Figure 43:
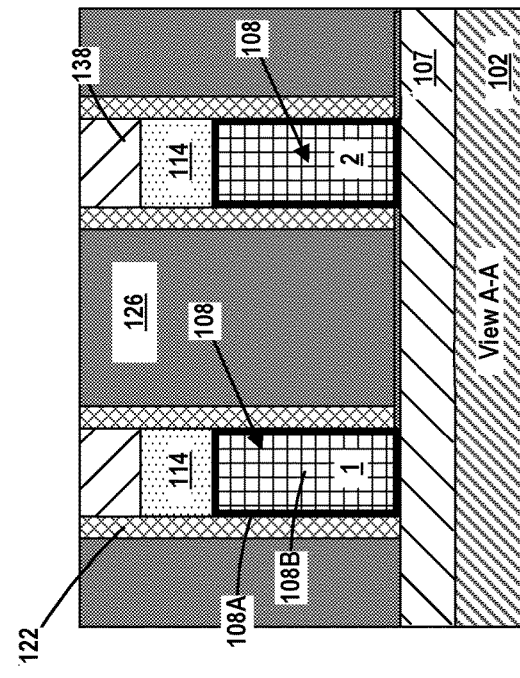
Figure 46:
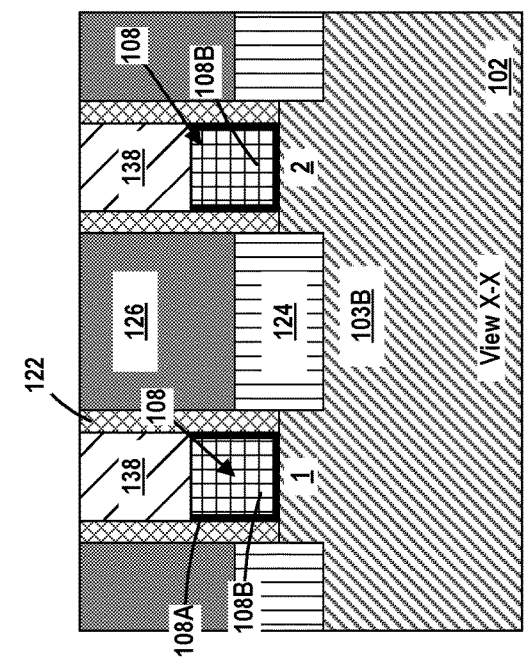
Figure 44:
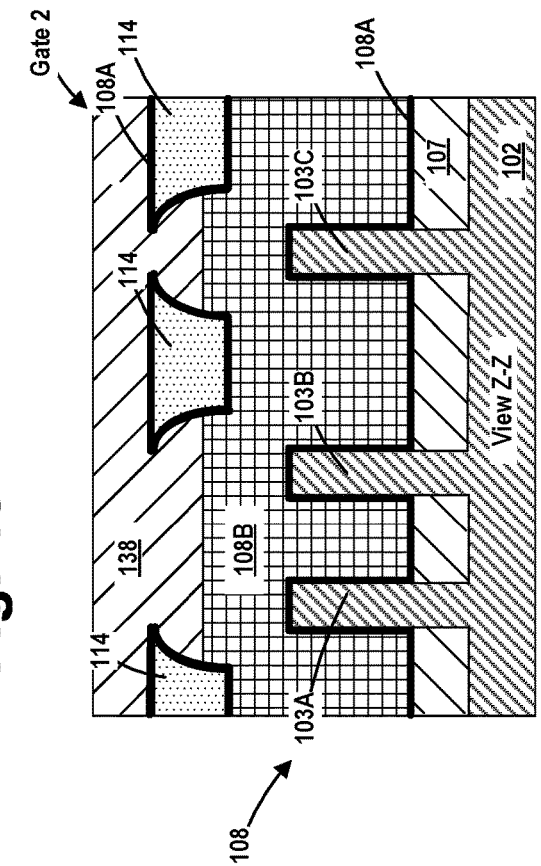
Figure 45:
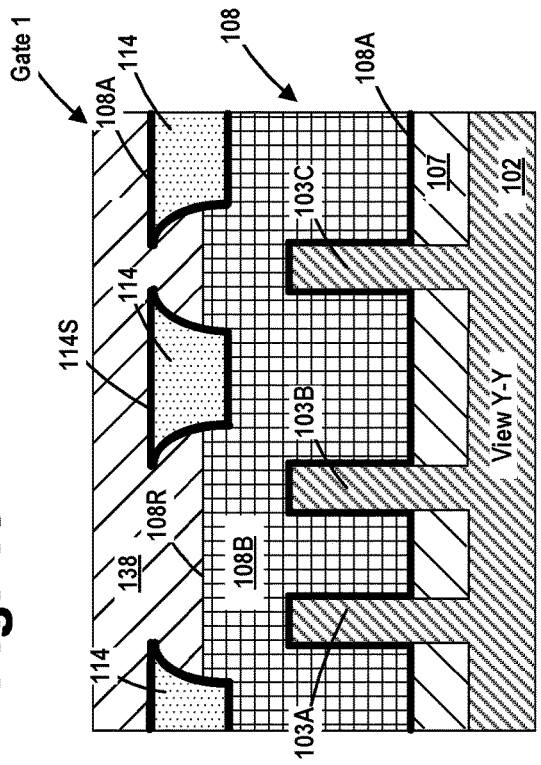
Figure 47:
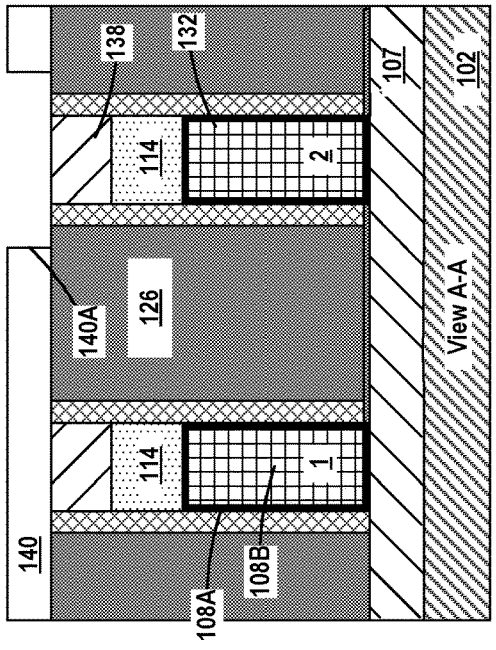
Figure 48:
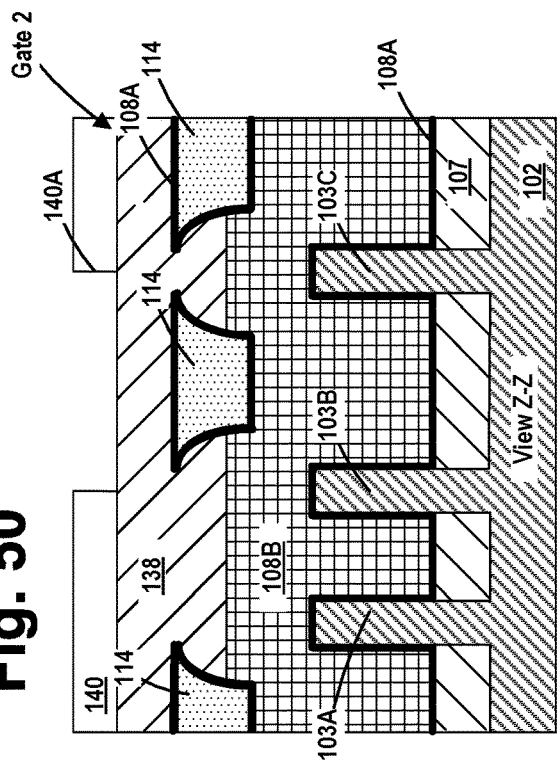
Figure 50:
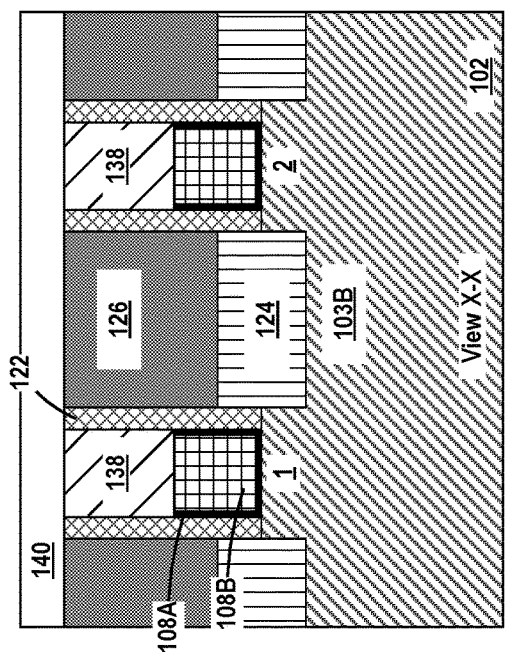
Figure 49:
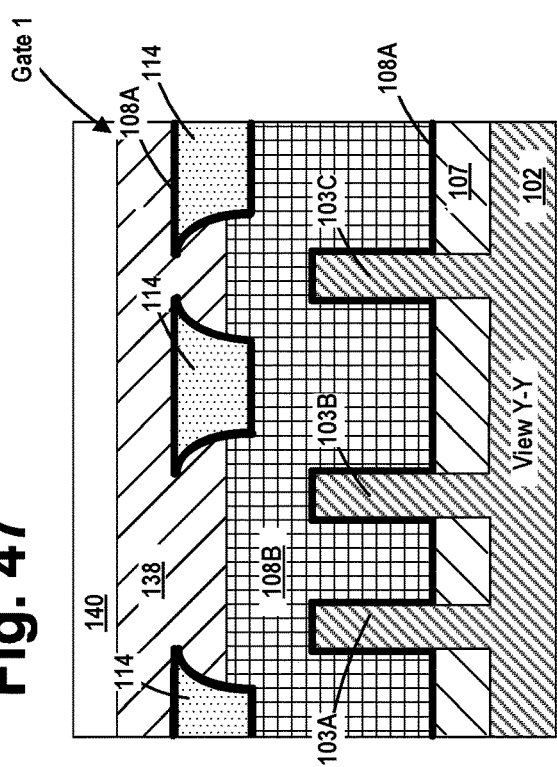
Figure 51:
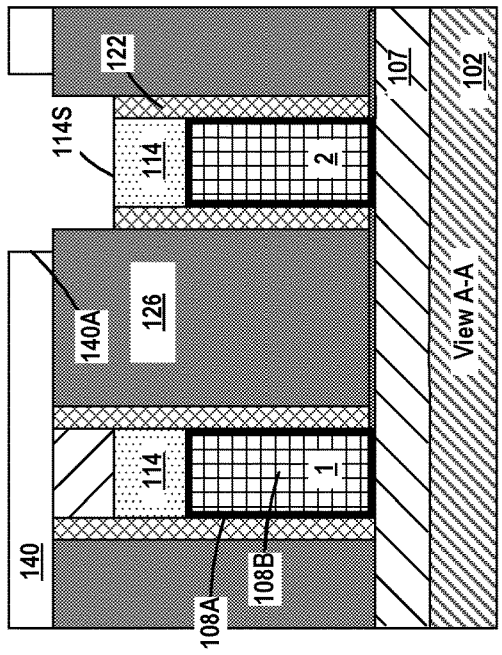
Figure 54:
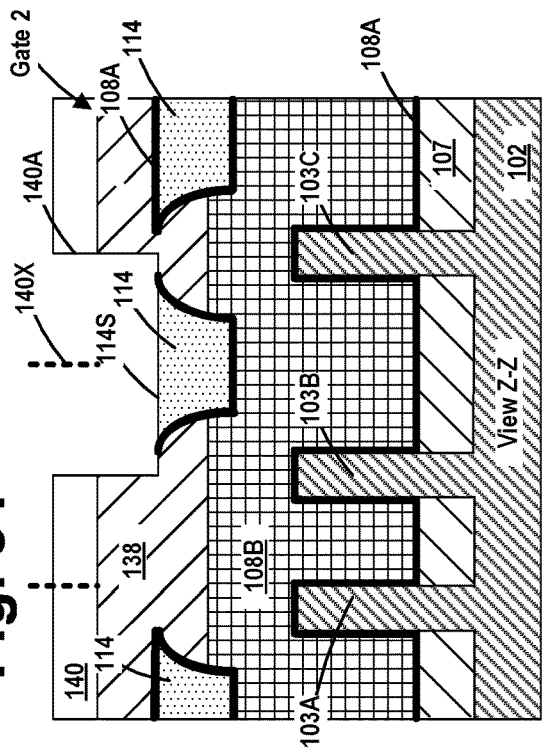
Figure 52:
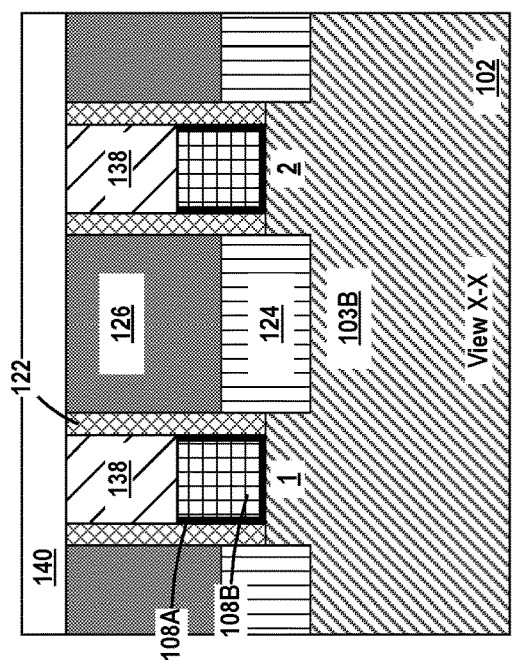

FIGS. 20-22 depict the product 100 after several process operations were performed. First, additional sacrificial material 110 (designated 110A) was deposited across the product 100 so as to overfill the cavities 113 above the fins 103. Thereafter, a CMP and/or etch-back process was performed to planarize the upper surface of the additional sacrificial material 110A. At that point, a layer of sacrificial gate cap material 116 was blanket-deposited across the product and above the additional sacrificial material 110A. The layer of sacrificial gate cap material 116 may be comprised of any of a variety of different materials, e.g., silicon nitride, and it may be formed to any desired thickness. If desired, a CMP and/or etch-back process may be performed on the upper surface of the layer of sacrificial gate cap material 116 to planarize its upper surface.

FIGS. 24-26A/B depict the product 100 after several process operations were performed. First, a patterned masking layer (not shown, e.g., a patterned layer of photoresist or OPL) was formed above the sacrificial gate cap material 116 using traditional manufacturing operations. Thereafter, one or more etching processes were performed though the patterned etch mask to remove exposed portions of the sacrificial gate cap material 116, the materials 110 and the portion 104A of the patterned etch mask 104. These process operations result in the formation of sacrificial gate structures 117A, 117B for gates 1 and 2, respectively, with sacrificial gate caps 116 positioned thereabove across the fins 103. Note that these process operations also remove the portions of the material 114 and the material 112 in the areas between the sacrificial gate structure 117A-B (see FIG. 23) and the formation of a plurality of multilayer gate-cut pillar structures 118 (included within the dashed-line region 120). In this embodiment, at this point in the process flow, the multilayer gate-cut pillar structure 118 comprises a lower section comprised of the material 112 and an upper portion comprised of the material 114. FIGS. 26A-B are cross-sectional views of the multilayer gate-cut pillar structure 118 in the gate width (GW) and the gate-length (GL) direction of the devices. With reference to FIG. 26A, the dimensions of the multilayer gate-cut pillar structure 118 at the bottom (118X) and at the top (118Y) in the gate width (GW) direction of the devices may vary depending upon the particular application. The upper dimension 118Y will typically be wider than the bottom 118X due to the self-aligned manner in which the multilayer gate-cut pillar structure 118 is formed between the spacers 110S. With reference to FIG. 26B, the dimensions of the multilayer gate-cut pillar structure 118 at the bottom (118S) and at the top (118T) in the gate length (GL) direction of the devices will typically be approximately the same and typically correspond to the critical dimension of the final gate structures 108 for the transistor devices.

FIGS. 27-30 depict the product 100 after several process operations were performed. First, sidewall spacers 122, e.g., silicon nitride, were formed adjacent the sacrificial gate structures 117A-B by performing a conformal deposition process and thereafter performing an anisotropic etching process. Then, epi semiconductor material 124 was formed in the source/drain regions of the devices. Next, a conformal contact etch stop layer (not shown) was formed on the spacers 122 and the epi material 124. Then, a layer of insulating material 126, e.g., silicon dioxide, was blanket-deposited across the product so as to overfill the spaces between the spacers 122 and above the contact etch stop layer and the epi material 124. Thereafter, a CMP and/or etch-back process was performed to planarize the upper surface of the layer of insulating material 126 with the sacrificial gate caps 116.

FIGS. 31-34 depict the product 100 after a CMP process was performed to remove the sacrificial gate caps 116 and thereby expose the sacrificial gate structures 117A-B for removal.

In one illustrative process flow, FIGS. 35-38 depict the product 100 after an etching process was performed to selectively remove the sacrificial materials 110 relative to the surrounding materials including the multilayer gate-cut pillar structures 118. This process operation removes the sacrificial materials 110A of the sacrificial gate structures 117A-B, the sacrificial spacers 110S and the blocks 110X of sacrificial material 110 and results in the formation of a plurality of replacement gate cavities 119.

In one illustrative process flow, FIGS. 39-42 depict the product 100 after an etching process was performed to selectively remove the lower sacrificial material portion 112 of the multilayer gate-cut pillar structures 118 relative to the surrounding materials including the upper portion (material 114) of the multilayer gate-cut pillar structures 118. This results in the formation of spaces 121 vertically below the remaining upper portion (material 114) of the multilayer gate-cut pillar structures 118. The spaces 121 effectively become part of the replacement gate cavities 119. Thereafter, another etching process was performed to selectively remove the exposed portions of the insulating layers 104A and 109 so as to thereby expose the upper surfaces 103S and sidewalls 103R of the fins 103. Of course, as will be appreciated by those skilled in the art, in other process flows, depending upon the materials selected for the materials 110 and 112, the materials 110 and 112 may be removed by performing a single etching process.

FIGS. 43-46 depict the product 100 after several process operations were performed to form final replacement gate structures 108 in the gate cavities 119 and to form a final gate cap layer 138 above the final gate structure 108. Note that the materials for the final gate structure 108 are also formed in the spaces 121 (see, e.g., FIG. 41) under the remaining upper portions (material 114) of the multilayer gate-cut pillar structures 118. In the illustrative example depicted herein, the final gate structures 108 are manufactured using known replacement gate manufacturing techniques. Using that manufacturing technique, the materials for the final gate structures 108 are sequentially formed in the gate cavities 119 between the spacers 122 and in the spaces 121. The final gate structures 108 are typically comprised of a high-k gate insulation layer 108A, such as hafnium oxide, a material having a dielectric constant greater than 10, etc., and one or more conductive material layers that function as the conductive gate electrode 108B of the gate structure 108. For example, one or more work-function adjusting metal layers (not separately shown), e.g., titanium, tantalum, titanium nitride, tantalum nitride, titanium carbide, etc., and a bulk conductive material (not separately shown), such as tungsten, may be deposited to form the conductive gate electrode 108B. Note that the high-k gate insulation layer 108A is formed on all exposed surfaces of the remaining upper portions (material 114) of the multilayer gate-cut pillar structures 118, i.e., on the surfaces of the upper portion (material 114) that are not in contact with the sidewall spacers 122 (see FIGS. 43 and 46). After the conductive materials of the gate electrode 108B are deposited, a recess etching process may be performed on the conductive materials such that the gate electrode 108B has a recessed upper surface 108R that is positioned at a level that is below the level of the upper surface 114S of the remaining upper portion 114 of the initial multilayer gate-cut pillar structures 118 (see FIG. 44). The amount of recessing of the conductive gate materials may vary depending upon the particular application, e.g., 15-60 nm. Note that the high-k gate insulation layer 108A remains in position around the remaining upper portion 114 of the initial multilayer gate-cut pillar structures 118 at this point in the process flow. Thereafter, in this particular embodiment, the final gate caps 138 were formed on the product 100 above the recessed gate materials and within the gate cavities 119 by depositing gate cap material above the recessed gate materials and performing a CMP process operation to planarize the upper surface of the final gate caps 138 with the upper surface of the layer of insulating material 126.

FIGS. 47-50 depict the product 100 after a patterned etch mask 140, e.g., a patterned layer of photoresist or OPL, with an opening 140A formed therein, was formed above the product 100. The patterned etch mask 140 is typically referred to as a "gate-cut" mask, as the opening 140A is positioned at the approximate location 105 (see FIG. 1) where it is desired to cut or remove a portion of the axial length of the final gate structure 108 for gate 2. In practice, there will be thousands of the openings 140A formed in the gate-cut mask 140. As will be appreciated by those skilled in the art after a complete reading of the present application, using the methods disclosed herein, due to the presence of one of the remaining upper portions (material 114) of the multilayer gate-cut pillar structures 118, the physical size and placement (overlay) of the opening 140A relative to the desired location of the cut 105 of the gate structure 108 is somewhat relaxed as compared to prior art process flows. For example, using the methods disclosed herein, the critical dimension of the opening 140A (in the gate width direction)

may be somewhat larger than the final desired critical dimension of the actual gate cut opening in the gate structure 108, and precise overlay of the opening 140A at the desired location of the ultimate gate cut may not be required.

Figure 53:
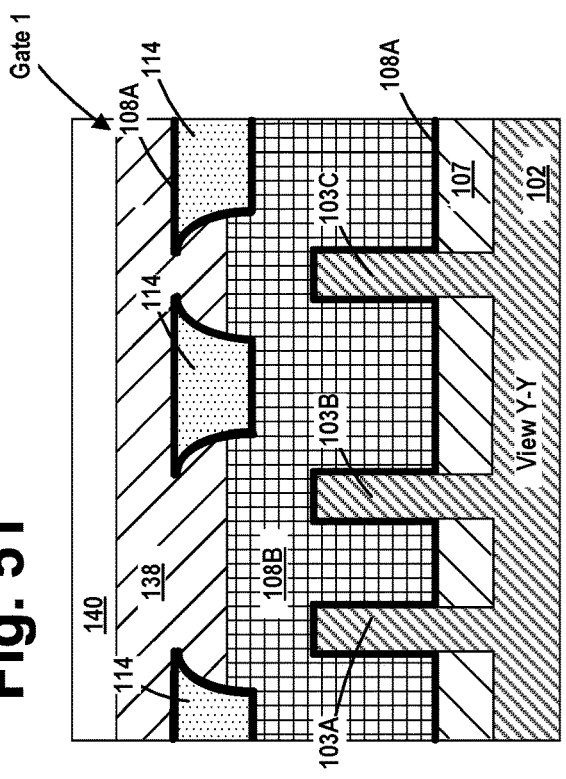
Figure 55:
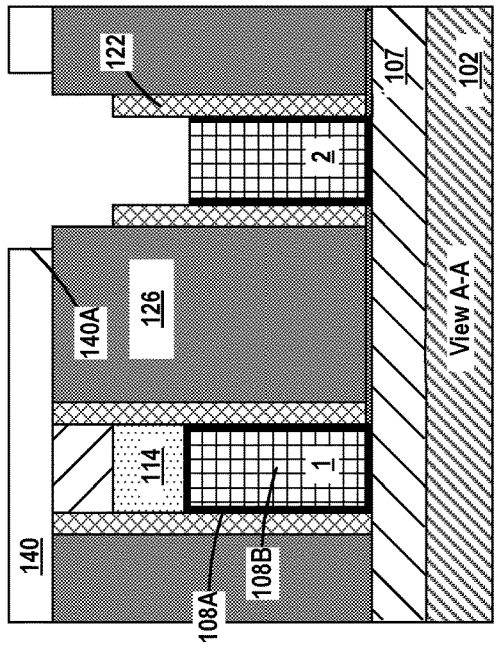
Figure 58:
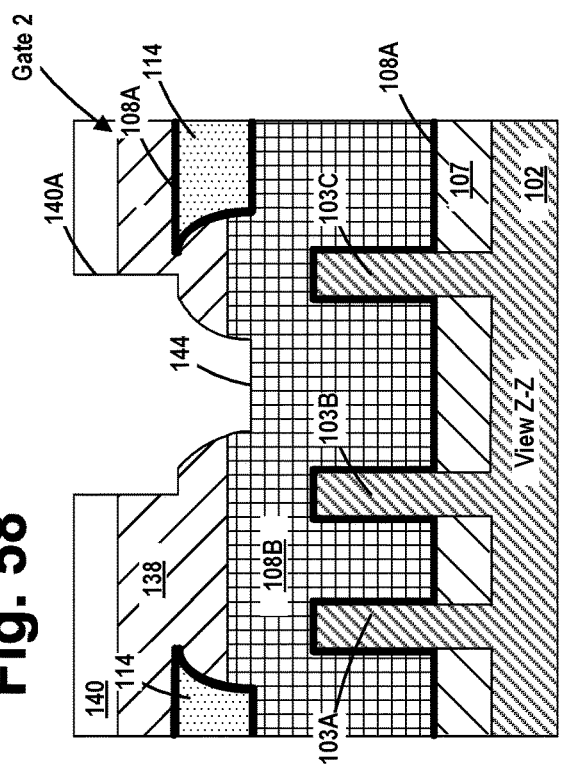
Figure 56:
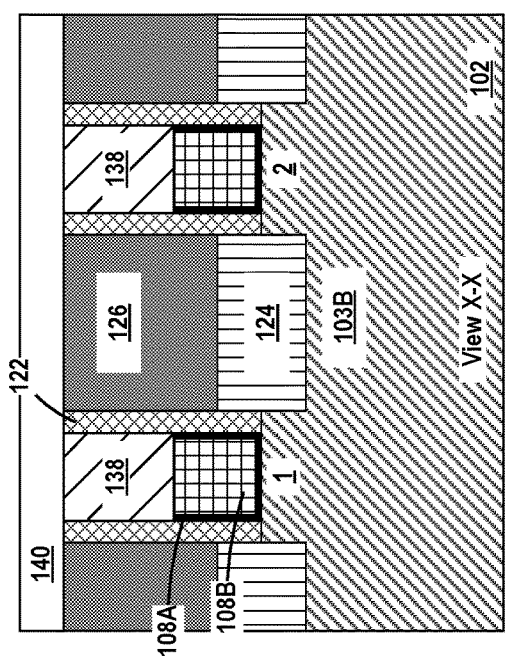
Figure 57:
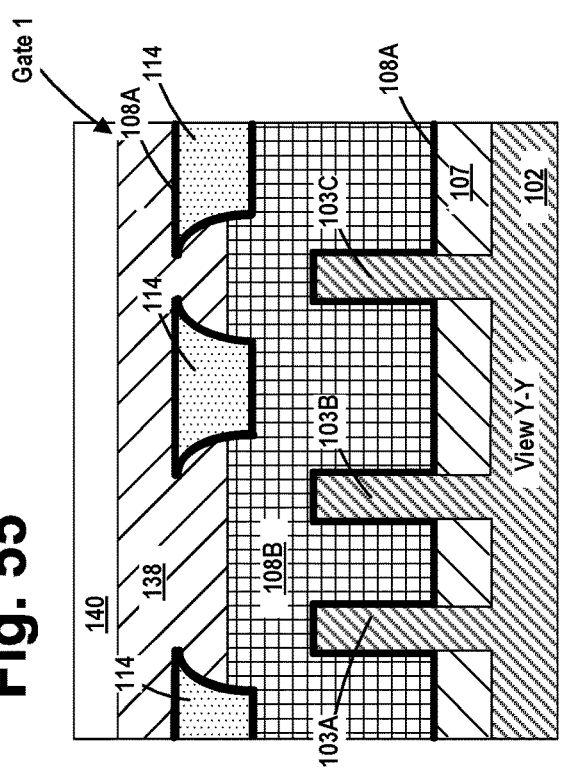
Figure 63:
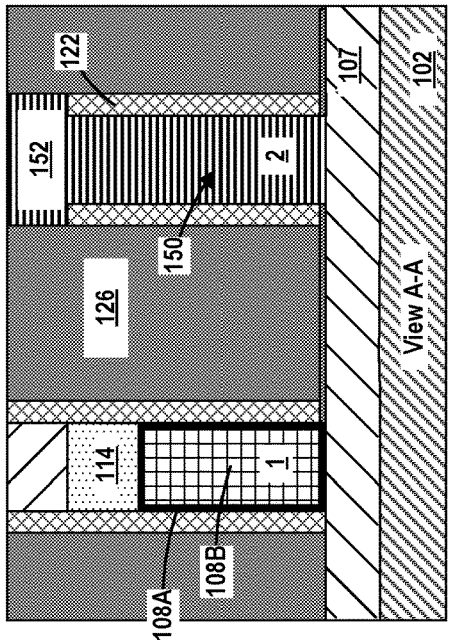
Figure 66:
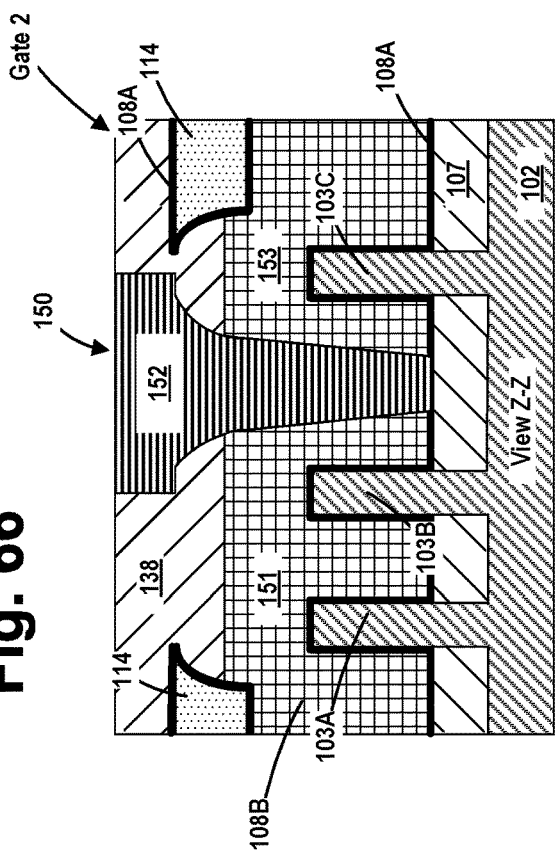
Figure 64:
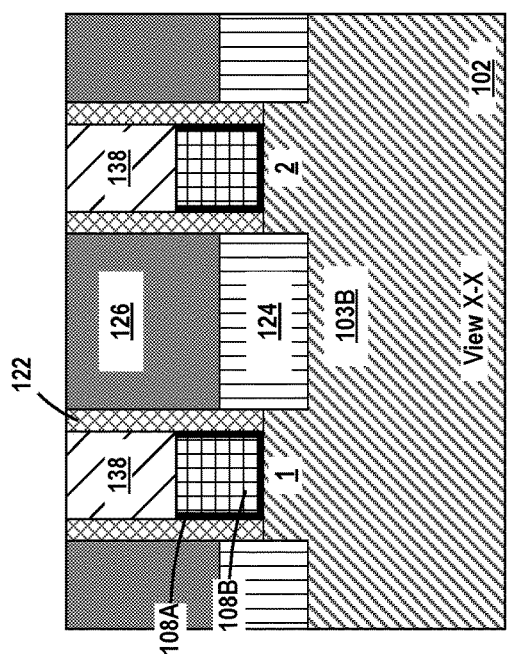
Figure 65:
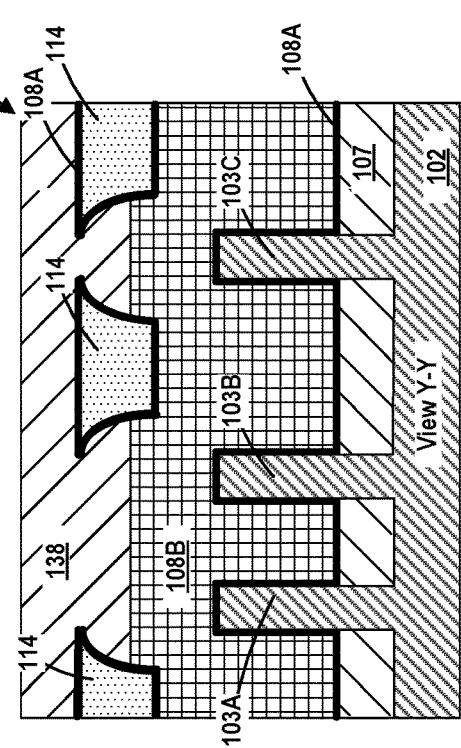

FIGS. 51-54 depict the product 100 after several process operations were performed. First, a timed, anisotropic etching process was performed on the final gate cap 138 so as to remove portions of the gate cap 138 under the opening 140A and above the remaining upper portion 114 of the initial multilayer gate-cut pillar structures 118. With reference to FIG. 53, note that, in this example, the critical dimension of the opening 140A (in the gate width direction of the devices) is greater than the critical dimension of the remaining upper portion 114 of the initial multilayer gate-cut pillar structures 118 in the same gate width direction. This initial etching process stops on the high-k gate insulation layer 108A positioned on the upper surface 114S. Thereafter, another etching process was performed to remove the exposed portions of the high-k insulating material 108A so as to expose the upper surface 114S of the remaining upper portion 114 of the initial multilayer gate-cut pillar structure 118. Note that, in the example depicted in the drawings, at the conclusion of these etching processes, the entire upper surface 114S of the remaining upper portion 114 of the initial multilayer gate-cut pillar structure 118 is exposed due to the larger size opening 140A and the depicted precise overlay of the opening 140A with respect to the remaining upper portion 114 of the initial multilayer gate-cut pillar structure 118. However, as will be appreciated by those skilled in the art after a complete reading of the present application, using the methods disclosed herein, such precision in overlay of the opening 140A with respect to the upper portion 114 (as depicted in the drawing) is not required. For example, if the opening 140A was laterally offset to the left in FIG. 53 (as indicated by dashed line 140X) from the idealized position shown in the drawings such that the opening 140A was only positioned vertically above less than an entirety of the upper surface 114S, the methods disclosed may still be used to perform the desired gate cutting activities.

FIGS. 55-58 depict the product 100 after several process operations were performed. Fist, an etching process was performed to remove the remaining upper portion 114 of the initial multilayer gate-cut pillar structures 118. Thereafter, another etching process was performed to remove the portions of the high-k gate insulation layer 108A exposed by the removal of the remaining upper portion 114 of the initial multilayer gate-cut pillar structure 118. These process operations result in the exposure of a portion 144 of the final gate structure 108 of gate 2 at the location 105 wherein it is desired to cut the gate 108. Note that this is a self-aligned process in that the portion 144 of the final gate structure 108 that is removed is the result of the removal of materials and is not the result of directly etching the gate structure 108 through a patterned etch mask having an opening in the patterned mask layer that corresponds to the final desired size of the gate cut opening.

FIGS. 59-62 depict the product 100 after one or more etching processes were performed to remove at least the conductive gate electrode 108B portion of the exposed portions of the gate structure 108 of gate 2 selectively relative to the surrounding materials. This process operation results in the formation of a gate-cut opening 150 in the gate structure 108 of gate 2 that effectively cuts the gate structure 108 of gate 2 into separate first 151 and second 153 gate structures (see FIG. 61). In the depicted example, both the conductive gate electrode 108B and the high-k insulating layer 108A are removed selectively relative to the surrounding materials.

FIGS. 63-66 depict the product 100 after several process operations were performed. First, the patterned etch mask 140 was removed. Next, a deposition process was performed so as to overfill the gate cut opening 150 with an insulating material, e.g., silicon nitride, silicon dioxide, a mixture of two or more materials of silicon oxide, silicon nitride and silicon carbide, a low-k insulating material (k value of 3.3. or less). Thereafter, one or more CMP process operations and/or etch-back process operations were performed that stop on the upper surface of the gate caps 138. This process operation removes excess amounts of the insulating material outside of the gate-cut opening 150. As a result, the remaining insulating material in the gate-cut opening 150 constitutes an insulating gate separation structure 152 with an upper surface that is substantially planar with the upper surface of the gate caps 138. At the point of processing depicted in FIGS. 63-66, the fabrication of the product 100 may be completed by performing traditional manufacturing techniques to form various standard features on the IC product 100. For example, one or more layers of insulating material (not shown) may be formed on the product 100. At that point, traditional manufacturing operations may be performed to form various contact structures that conductively contact various components of the transistor devices, e.g., source/drain regions, the gate structures, etc.

FIGS. 67-98 depict yet other illustrative methods of cutting gate structures in a self-aligned manner, various embodiments of a multilayer gate-cut pillar structure and various novel integrated circuit (IC) product structures. Relative to the previous process flow, in this process flow, the sacrificial material layer 112 will be recessed at a later point in the process flow.

Figure 67:
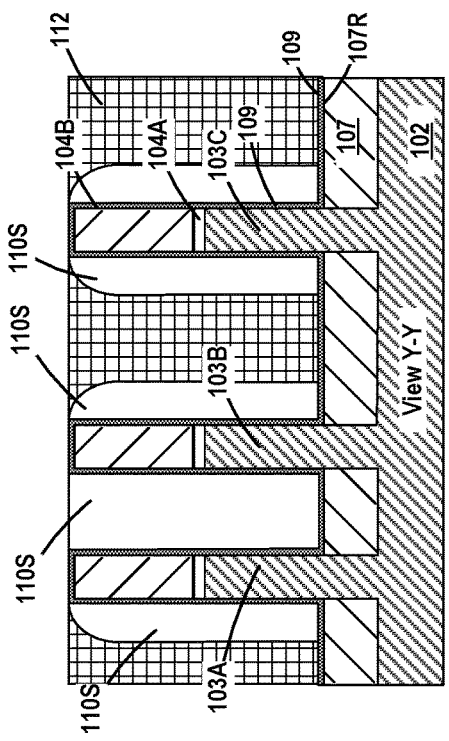
Figure 68:
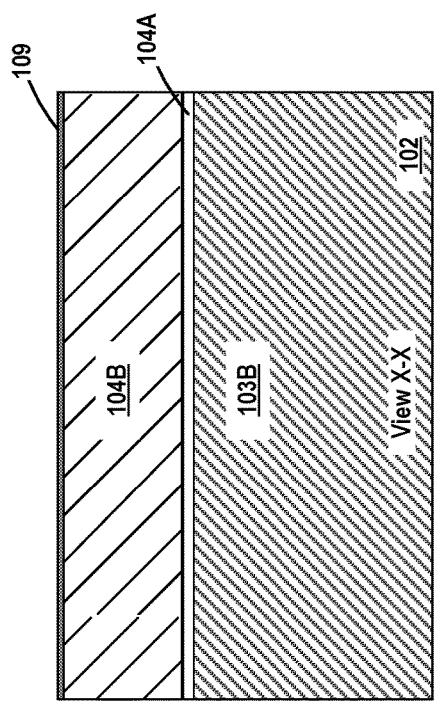
Figure 69:
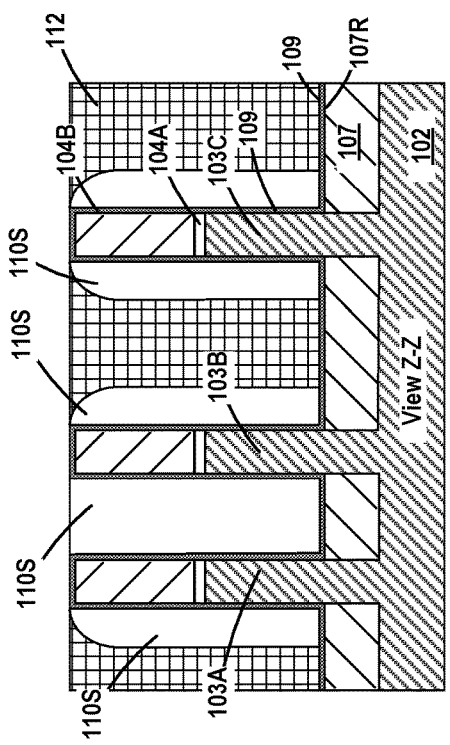

FIGS. 67-69 depict the product 100 at a point in the process flow that corresponds to that depicted in FIGS. 8-10 above, i.e., after the formation of the layer of sacrificial material 112 and the planarization of its upper surface.

Figure 72:
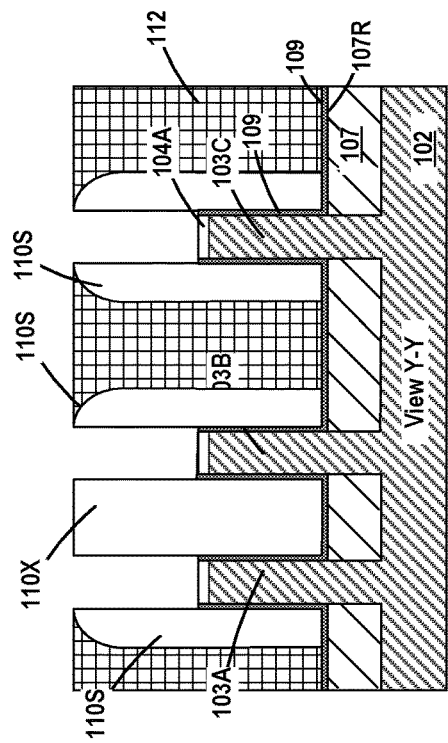
Figure 70:
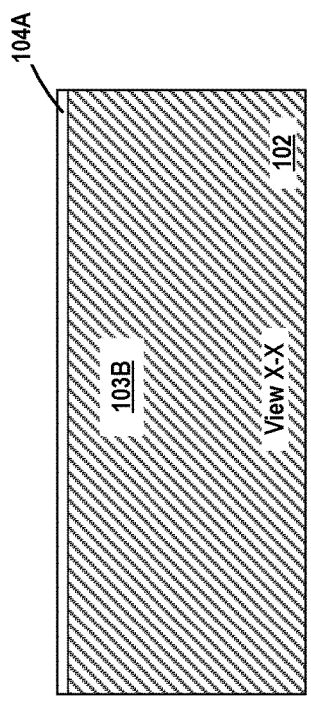
Figure 71:
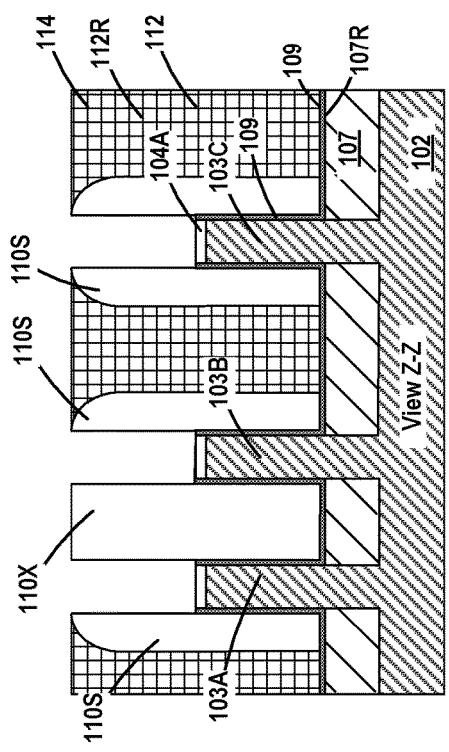

FIGS. 70-72 depict the product after the activities described above with reference to FIGS. 17-19 were performed to remove the exposed portions of the layer of insulating material 109 and, thereafter, the portions 104B of the patterned etch mask 104.

Figure 75:
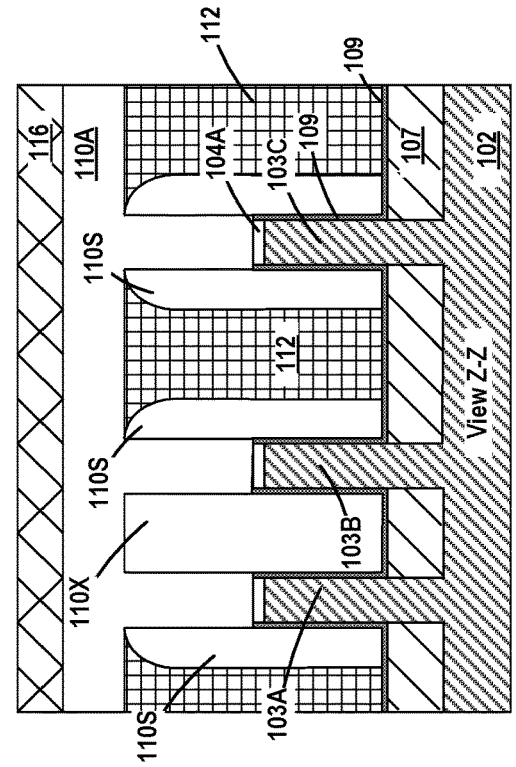
Figure 73:
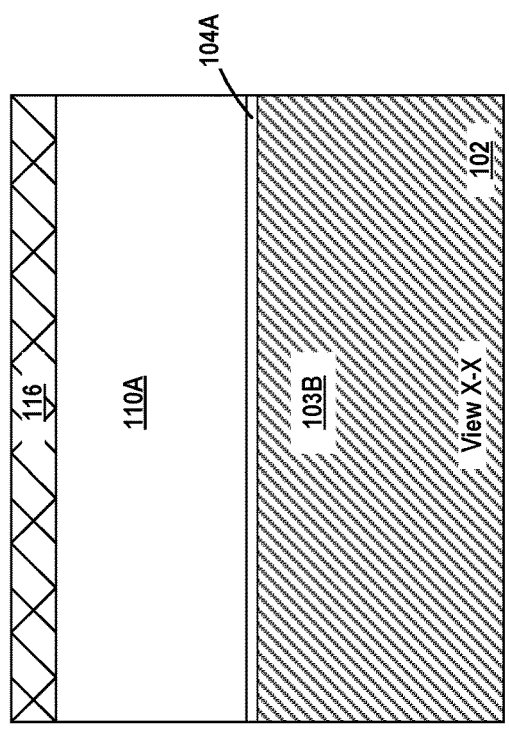
Figure 74:
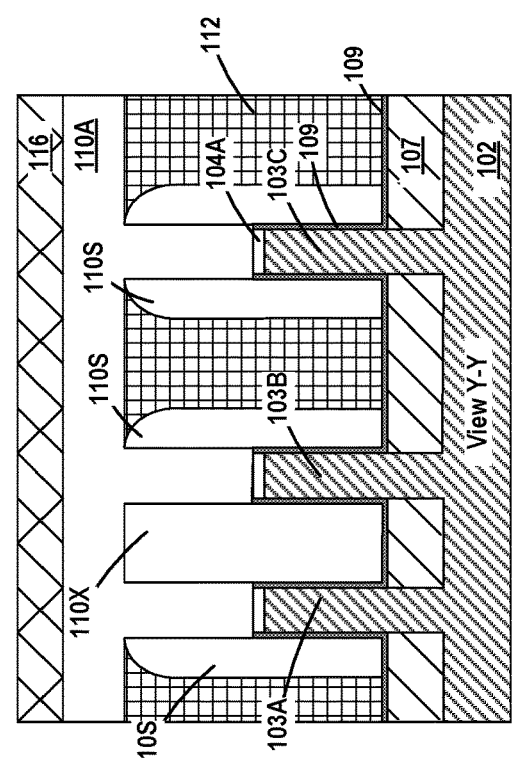
Figure 79:
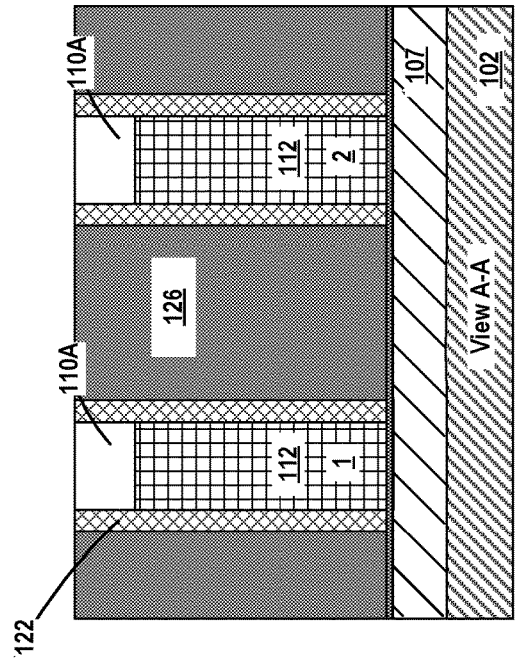
Figure 82:
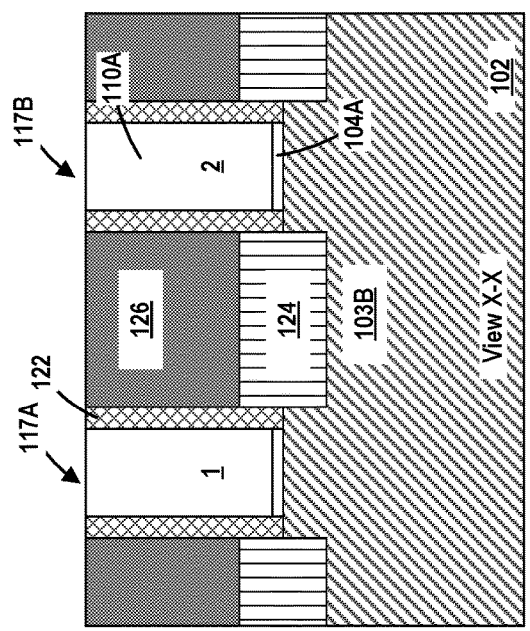
Figure 80:
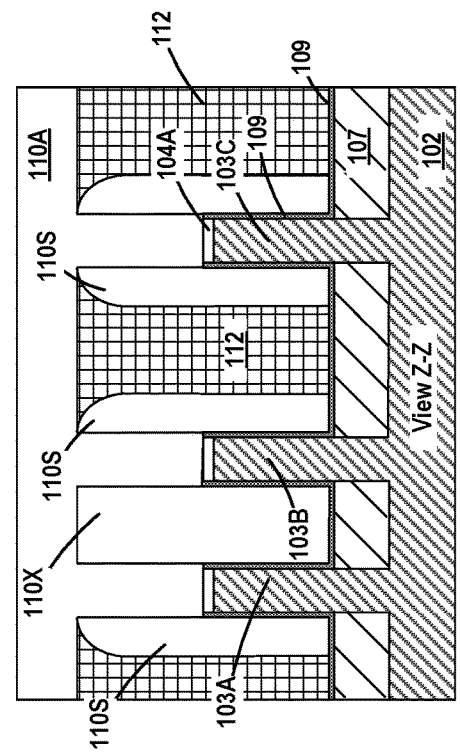
Figure 81:
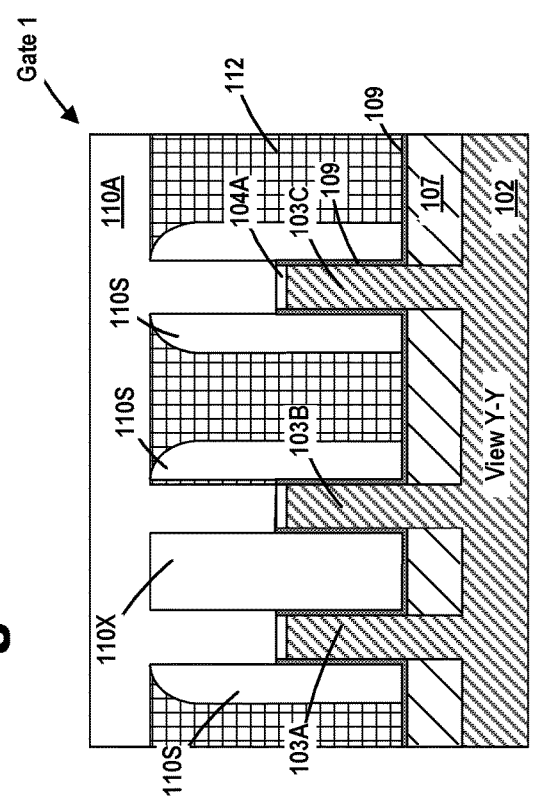
Figure 83:
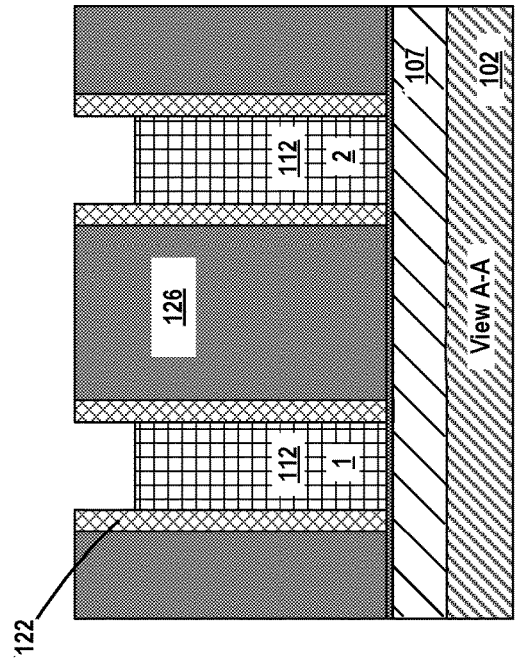
Figure 85:
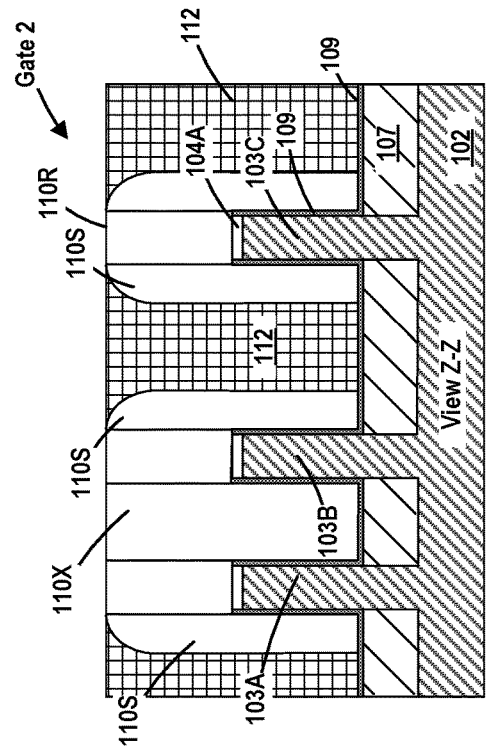
Figure 84:
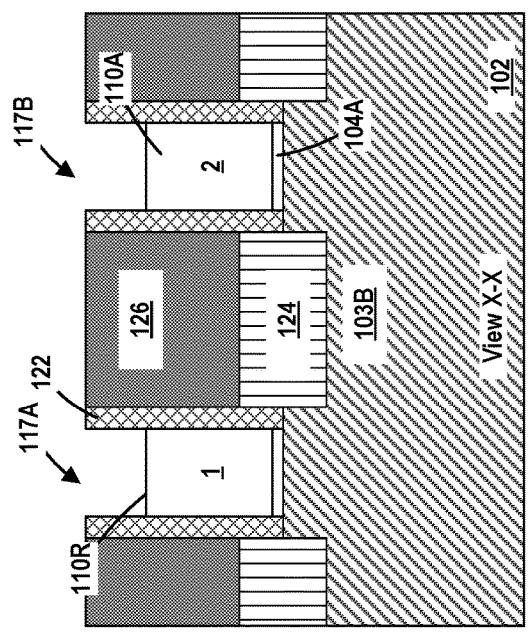
Figure 86:
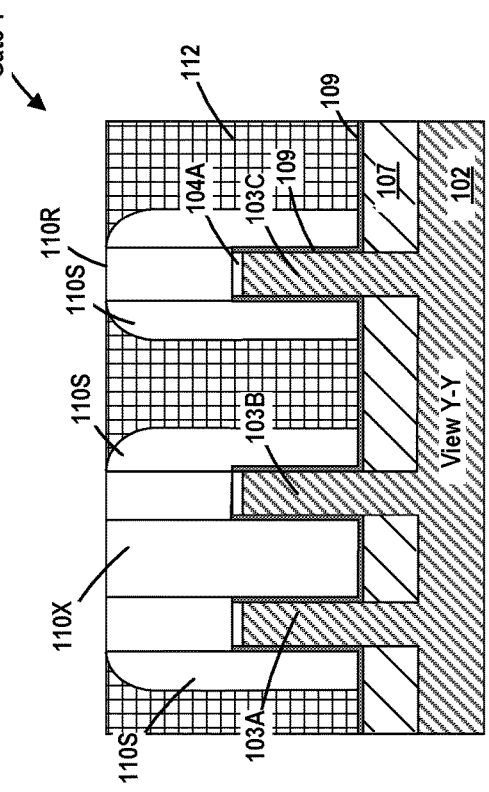

FIGS. 73-75 depict the product 100 after the activities described above with reference to FIGS. 20-22 were performed to deposit and planarize additional sacrificial material 110 (designated 110A) across the product 100 so as to overfill the cavities 113 above the fins 103 and thereafter to deposit a layer of sacrificial gate cap material 116 across the product and above the additional sacrificial material 110 (designated 110A).

FIGS. 76-78A/B depict the product 100 after the activities described above with reference to FIGS. 23-26A/B were performed to form the above-described sacrificial gate structures 117A, 117B for gates 1 and 2, respectively, with sacrificial gate caps 116 positioned thereabove, across the fins 103. With reference to FIG. 78A, the dimensions of the material 112 portion of the multilayer gate-cut pillar structure 118 at the bottom (118X) and at the top (118Y) in the gate width (GW) direction of the devices may vary depending upon the particular application. As before, the upper dimension 118Y will typically be wider than the bottom 118X due to the self-aligned manner in which the multilayer gate-cut pillar structure 118 is formed between the spacers 110S. With reference to FIG. 78B, the dimensions of the material 112 portion of the multilayer gate-cut pillar structure 118 at the bottom (118S) and at the top (118T) in the gate length (GL) direction of the devices will typically be approximately the same and typically correspond to the critical dimension of the final gate structures 108 for the transistor devices.

FIGS. 79-82 depict the product 100 after the activities described above with reference to FIGS. 27-30 were performed to form the sidewall spacers 122 and the layer of insulating material 126 across the product so as to overfill the spaces between the spacers 122. FIGS. 79-82 also depict the process operations performed to remove the sacrificial gate caps 116 and thereby expose the sacrificial gate structures 117A-B for removal, as described above in connection with FIGS. 31-34.

FIGS. 83-86 depict the product 100 after a recess etching process was performed on the sacrificial materials 110 relative to the surrounding materials so as to expose the upper surface of the sacrificial material 112 (see FIG. 86) positioned above the isolation material 107. The material 110A now has a recessed upper surface 110R. The amount of recessing of the conductive gate materials may vary depending upon the particular application.

FIGS. 87-90 depict the product after the activities described above with reference to FIGS. 11-13 were performed to recess the sacrificial material 112 such that it has a recessed upper surface 112R.

Figure 91:
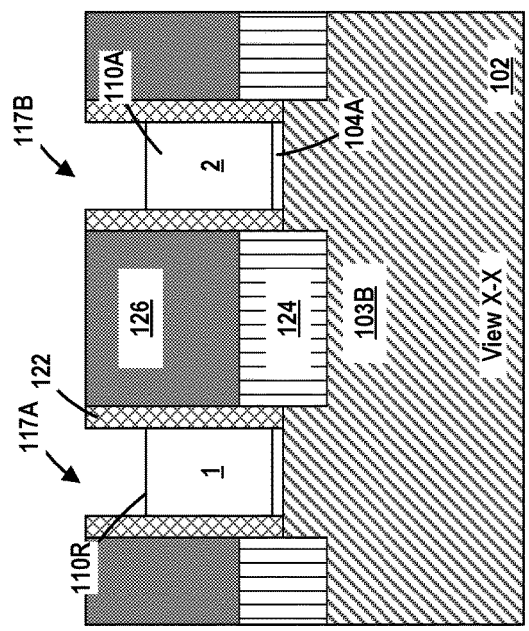
Figure 94:
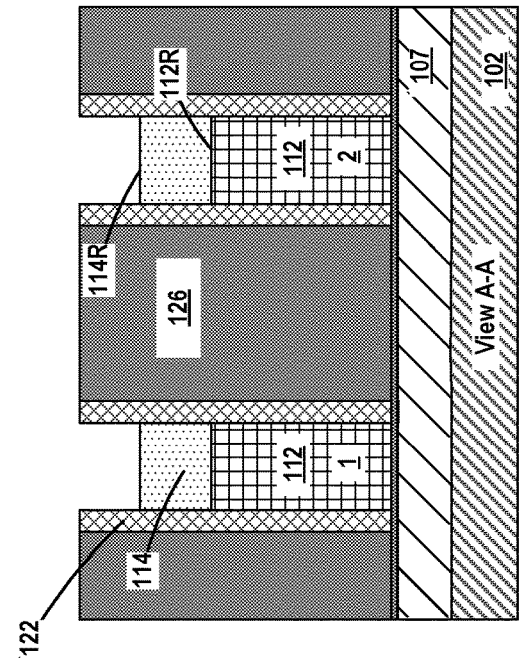
Figure 92:
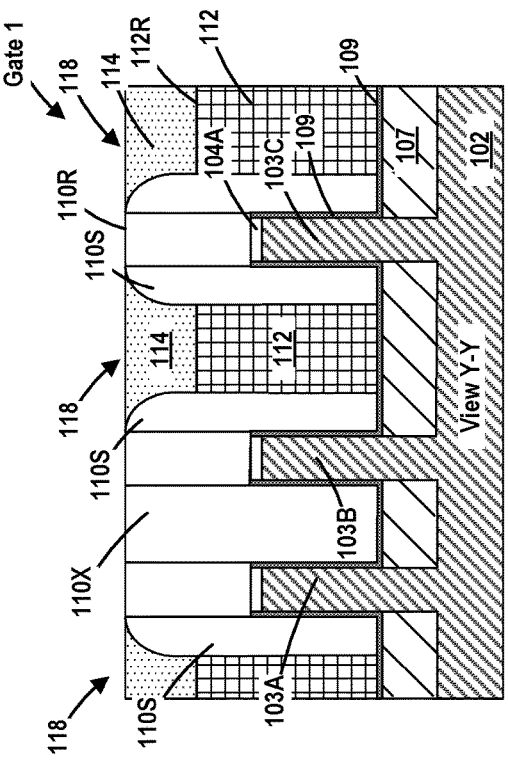
Figure 93:
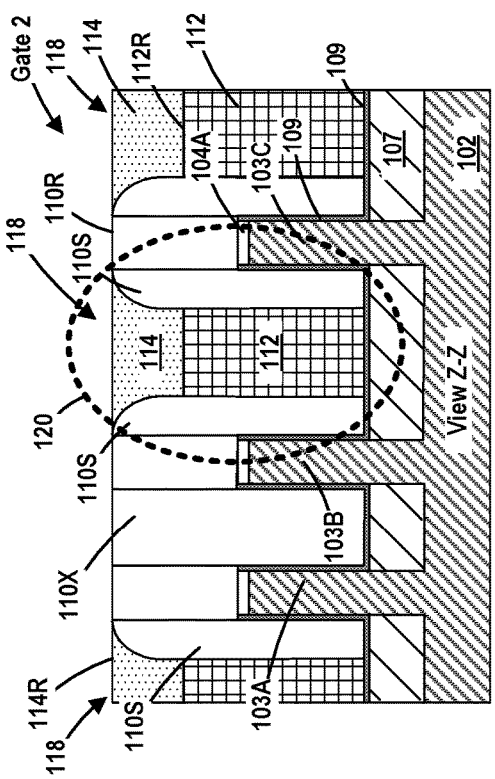
Figure 95:
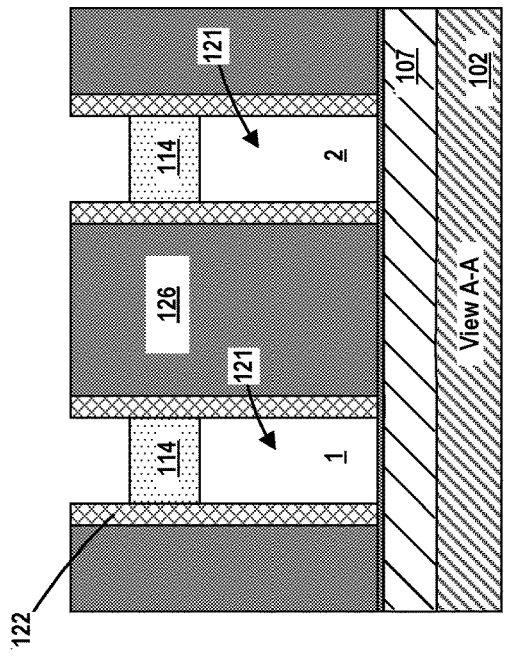
Figure 97:
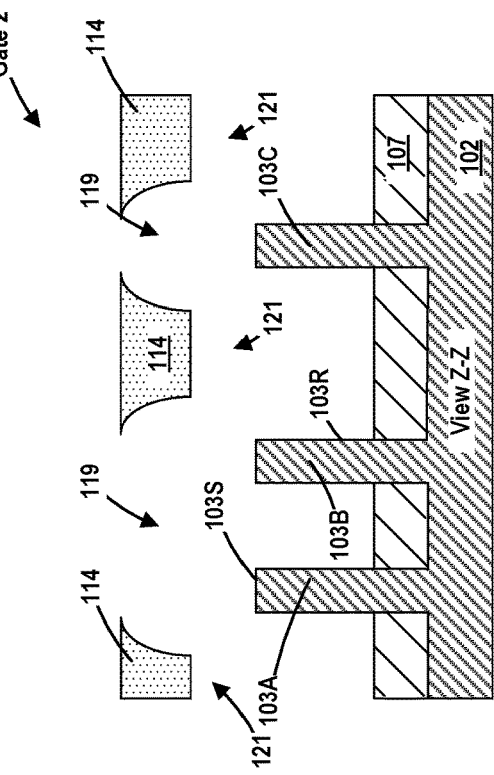
Figure 96:
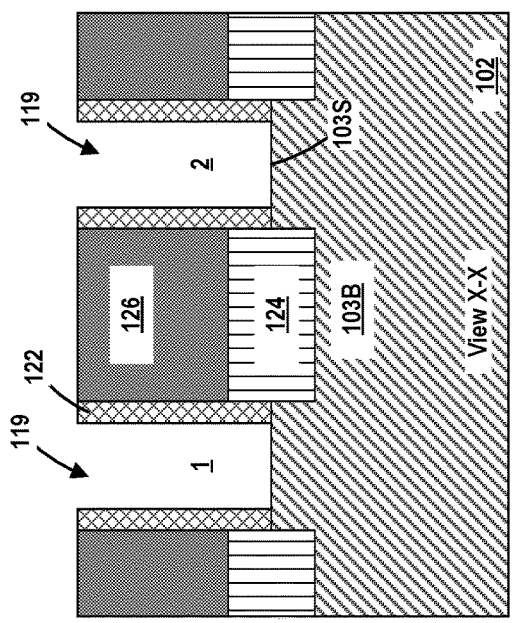

FIGS. 91-94 depict the product 100 after several process operations were performed. First, the above-described layer of material 114 was formed across the product 100 above the recessed layer of sacrificial material 112 and in the spaces between the sacrificial spacers 110S. As initially deposited, the layer of material has an as-deposited upper surface that is positioned above the upper surface of the layer of insulating material 126, i.e., the layer of material over-fills all of the underlying openings and spaces on the product 100. Thereafter, a CMP process was performed on the layer of material 114 such that the upper surface of the layer of material 114 was substantially planar with the upper surface of the insulating material 126. At that point, a recess etching process was performed on the layer of material 114 such that it has a recessed upper surface 114R that is substantially planar with the upper surfaces 110R of the block 110X of the sacrificial material 110. As best seen in FIG. 91, these process operations clear the layer of material 114 from above the upper surface of the sacrificial gate structures 117A-B. With reference to FIGS. 92 and 93, these process operations result in the formation of a plurality of the above-described multilayer gate-cut pillar structures 118 (included within the dashed-line region 120).

FIGS. 95-98 depict the product after the activities described above with reference to FIGS. 35-42 were performed to (1) remove the sacrificial materials 110 relative to the surrounding materials including the multilayer gate-cut pillar structures 118 and thereby form the above-described replacement gate cavities 119, (2) selectively remove the lower sacrificial material portion 112 of the multilayer gate-cut pillar structures 118 relative to the surrounding materials including the upper portion (material 114) of the multilayer gate-cut pillar structures 118 so as to form the above-described spaces 121 vertically below the remaining upper portion (material 114) of the multilayer gate-cut pillar structures 118; and (3) selectively remove the exposed portions of the insulating layers 104A and 109 so as to thereby expose the upper surfaces 103S and sidewalls 103R of the fins 103. At the point of processing depicted in FIGS. 94-98, the product may be completed by performing the processing steps described in FIGS. 43-66 above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device, comprising:
    a final gate structure, the final gate structure comprising a gate insulation layer comprising a high-k material (k value of 10 or greater) and a gate electrode comprising at least one conductive material, the final gate structure comprising opposing lateral sidewalls and an axial length in a direction that corresponds to a gate width direction of the transistor device;
    a sidewall spacer contacting the opposing lateral sidewalls of the final gate structure;
    a pillar structure positioned above at least a portion of the final gate structure at a location along the axial length of the final gate structure, the pillar structure comprising a pillar material wherein, when the pillar structure is viewed in a cross-section taken through the pillar structure in a direction that corresponds to the gate width direction of the transistor device, the pillar structure comprises an outer perimeter; and
    a layer of the high-k material is positioned around the entire outer perimeter of the pillar material.

2. The transistor device of claim 1, wherein the pillar structure comprises first and second side surfaces that contact an internal surface of the sidewall spacer, wherein the first and second side surfaces of the pillar structure are free of the high-k insulating material.

3. The transistor device of claim 1, wherein, when the pillar structure is viewed in a cross-section taken through the pillar structure in a direction that corresponds to a gate length direction of the transistor device, the pillar structure has a substantially uniform width throughout an entire vertical height of the pillar structure.

4. The transistor device of claim 1, wherein, when the pillar structure is viewed in a cross-section taken through the pillar structure in a direction that corresponds to the gate width direction of the transistor device, an upper surface of the pillar structure has a first dimension in the gate width direction and a lower surface of the pillar structure has a second dimension in the gate width direction, wherein the first dimension is greater than the second dimension.

5. The transistor device of claim 1, wherein the pillar material comprises one of silicon carbon or SiOC and wherein the transistor device is a FinFET device.

6. The transistor device of claim 1, wherein the gate electrode comprises an upper surface and the pillar structure comprises a lower surface, wherein the lower surface of the pillar structure is positioned at a level that is below a level of the upper surface of the gate electrode.

7. The transistor device of claim 1, wherein a portion of the pillar structure extends into a portion of the gate electrode for a first vertical distance.

8. A transistor device, comprising:
a final gate structure, the final gate structure comprising a gate insulation layer comprising a high-k material (k value of 10 or greater) and a gate electrode comprising at least one conductive material, the final gate structure comprising opposing lateral sidewalls and an axial length in a direction that corresponds to a gate width direction of the transistor device;
a sidewall spacer contacting the opposing lateral sidewalls of the final gate structure;
a pillar structure positioned above at least a portion of the final gate structure at a location along the axial length of the final gate structure, the pillar structure comprising a pillar material, wherein, when the pillar structure is viewed in a cross-section taken through the pillar structure in a direction that corresponds to the gate width direction of the transistor device, the pillar structure comprises an outer perimeter and wherein the pillar structure comprises first and second side surfaces that contact an internal surface of the sidewall spacer and wherein a portion of the pillar structure extends into a portion of the gate electrode for a first vertical distance; and
a layer of the high-k material is positioned around the entire outer perimeter of the pillar structure, wherein the first and second side surfaces of the pillar structure are free of the high-k insulating material.

9. The transistor device of claim 8, wherein, when the pillar structure is viewed in a cross-section taken through the pillar structure in a direction that corresponds to a gate length direction of the transistor device, the pillar structure has a substantially uniform width throughout an entire vertical height of the pillar structure.

10. The transistor device of claim 8, wherein, when the pillar structure is viewed in a cross-section taken through the pillar structure in a direction that corresponds to the gate width direction of the transistor device, an upper surface of the pillar structure has a first dimension in the gate width direction and a lower surface of the pillar structure has a second dimension in the gate width direction, wherein the first dimension is greater than the second dimension.

11. The transistor device of claim 8, wherein the gate electrode comprises an upper surface and the pillar structure comprises a lower surface, wherein the lower surface of the pillar structure is positioned at a level that is below a level of the upper surface of the gate electrode.

12. A transistor device, comprising:
a final gate structure, the final gate structure comprising a gate insulation layer comprising a high-k material (k value of 10 or greater) and a gate electrode comprising at least one conductive material, the final gate structure comprising opposing lateral sidewalls and an axial length in a direction that corresponds to a gate width direction of the transistor device;
a sidewall spacer contacting the opposing lateral sidewalls of the final gate structure;
a pillar structure positioned above at least a portion of the final gate structure at a location along the axial length of the final gate structure, the pillar structure comprising a pillar material, wherein, when the pillar structure is viewed in a cross-section taken through the pillar structure in a direction that corresponds to the gate width direction of the transistor device, the pillar structure comprises an outer perimeter, an upper surface and a lower surface, wherein the upper surface of the pillar structure has a first dimension in the gate width direction and the lower surface of the pillar structure has a second dimension in the gate width direction, wherein the first dimension is greater than the second dimension and wherein, when the pillar structure is viewed in a cross-section taken through the pillar structure in a direction that corresponds to a gate length direction of the transistor device, the pillar structure has a substantially uniform width throughout an entire vertical height of the pillar structure; and
a layer of the high-k material is positioned around the entire outer perimeter of the pillar structure.

13. The transistor device of claim 12, wherein the pillar structure comprises first and second side surfaces that contact an internal surface of the sidewall spacer, wherein the first and second side surfaces of the pillar structure are free of the high-k insulating material.

14. The transistor device of claim 12, wherein the pillar material comprises one of silicon carbon or SiOC and wherein the transistor device is a FinFET device.

15. The transistor device of claim 12, wherein the gate electrode comprises an upper surface and the pillar structure comprises a lower surface, wherein the lower surface of the pillar structure is positioned at a level that is below a level of the upper surface of the gate electrode.

16. The transistor device of claim 12, wherein a portion of the pillar structure extends into a portion of the gate electrode for a first vertical distance.

* * * * *